US012805093B2

(12) United States Patent
Nakai et al.

(10) Patent No.: US 12,805,093 B2
(45) Date of Patent: Nov. 17, 2026

(54) LIGHT EMITTING DEVICE

(71) Applicant: Oki Electric Industry Co., Ltd., Tokyo (JP)

(72) Inventors: Yusuke Nakai, Tokyo (JP); Takuma Ishikawa, Tokyo (JP); Shinya Jumonji, Tokyo (JP); Genichirou Matsuo, Tokyo (JP); Hiroto Kawada, Tokyo (JP); Akihiro Iino, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 367 days.

(21) Appl. No.: 18/507,528

(22) Filed: Nov. 13, 2023

(65) Prior Publication Data

US 2024/0213291 A1 Jun. 27, 2024

(30) Foreign Application Priority Data

Dec. 26, 2022 (JP) ................................ 2022-208510

(51) Int. Cl.
*H01L 27/15* (2006.01)
*H10H 20/855* (2025.01)
*H10H 29/10* (2025.01)

(52) U.S. Cl.
CPC .......... *H10H 29/10* (2025.01); *H10H 20/855* (2025.01)

(58) Field of Classification Search
CPC ............................ H10H 29/10; H10H 20/855
See application file for complete search history.

(56) References Cited

U.S. PATENT DOCUMENTS

2021/0126043 A1* 4/2021 Lee ........................ H10H 29/10
2022/0417236 A1 12/2022 Ochi et al.

FOREIGN PATENT DOCUMENTS

CN 110783366 A 2/2020
JP 2002351359 A 12/2002
JP 2010-062351 A 3/2010

OTHER PUBLICATIONS

Extended European Search Report issued in connection with counterpart European Patent Application No. 25181313.5 dated Jul. 28, 2025.
Office Action issued for corresponding Japanese patent application No. 2022-208510, and its English translation, dated May 12, 2026.

* cited by examiner

*Primary Examiner* — William C Trapanese
(74) *Attorney, Agent, or Firm* — Rabin & Berdo, P.C.

(57) ABSTRACT

A light emitting device includes a first layer including a first light emitting element that has a first light emission region and a first transparent insulation member that covers the first light emitting element; a second layer stacked on the first layer and including a second light emitting element that has a second light emission region and a second transparent insulation member that covers the second light emitting element; and a third layer stacked on the second layer and including a third light emitting element that has a third light emission region, at least partially overlapping with the first light emission region and the second light emission region, and a third transparent insulation member that covers the third light emitting element, wherein the third light emission region is formed so that its area is larger than the first light emission region and the second light emission region.

15 Claims, 10 Drawing Sheets

LIGHT EMITTING DEVICE

BACKGROUND OF THE INVENTION

1. Field of the Invention

The present disclosure relates to a light emitting device, and is suitable for application to light emitting devices in which semiconductor elements are mounted on a circuit board, for example.

2. Description of the Related Art

In recent years, light emitting devices like display devices displaying an image by selectively driving a plurality of semiconductor elements mounted on a circuit board like a matrix to make the driven semiconductor elements emit light have become widespread. In such light emitting devices, a system in which semiconductor elements of a plurality of colors constituting each pixel are arranged to be arrayed on a plane parallel to an image surface is commonly employed; however, there is a problem in that it is difficult to realize higher pixel density. In such a circumstance, there has been proposed a light emitting device (multilayer semiconductor light emitting device) employing a multilayer structure in which the semiconductor elements of the plurality of colors constituting each pixel are arranged to be stacked in a direction orthogonal to the image surface (see Japanese Patent Application Publication No. 2010-62351 (e.g., FIG. 1), for example).

In regard to this light emitting device, it has been known that the ratio of absorption of light of a color with a relatively short wavelength (e.g., blue color) by an element of a color with a relatively long wavelength (e.g., red color) becomes high due to properties of materials forming the semiconductor element and the light amount (luminance) of the light emitted from a light emission surface decreases. Therefore, in the aforementioned multilayer semiconductor light emitting device, a sufficient light amount of the light of each color is secured by arranging an element emitting light of a relatively short wavelength such as the blue color on a light emission direction side.

Incidentally, when an intended color is expressed by a combination of semiconductor elements of a plurality of colors (e.g., red color, green color, and blue color) in each pixel forming the image, as its prerequisite, it is necessary to adjust the ratio among light emission amounts of the respective colors to suit a predetermined reference color such as the white color of the CIE (Commission Internationale de l'Eclairage) standard light source D65, for example.

However, in the above-described light emitting device, if the semiconductor elements are miniaturized for the purpose of further increasing the pixel density, luminous efficiency as the ratio of the light emission amount to supplied electric power can deteriorate in semiconductor elements emitting light of a certain color (e.g., red color). Further, in regard to the semiconductor elements, electric power that can be supplied to a semiconductor element is limited due to problems such as electric power capacity and heating of wiring members, and the light emission amount is also limited accordingly.

Thus, in the above-described light emitting device, there is a problem in that there arises the need to also reduce the light amount of another color to match the light amount of a color for which a sufficient light emission amount cannot be obtained, and consequently, brightness of each pixel cannot be increased and quality of the image cannot be improved, that is, the light emission property is insufficient.

SUMMARY OF THE INVENTION

An object of the present disclosure is to provide a light emitting device capable of improving the light emission property.

A light emitting device includes a first layer including a first light emitting element that makes a first light emission region emit light and a first transparent insulation member that covers the first light emitting element; a second layer stacked on a light emission direction side of the first layer and including a second light emitting element that makes a second light emission region emit light and a second transparent insulation member that covers the second light emitting element; and a third layer stacked on the light emission direction side of the second layer and including a third light emitting element that makes a third light emission region, at least partially overlapping with the first light emission region and the second light emission region as viewed from the light emission direction, emit light and a third transparent insulation member that covers the third light emitting element, wherein the third light emission region is formed so that its area as viewed from the light emission direction is larger than the first light emission region and the second light emission region.

A light emitting device includes a first layer including a first light emitting element that makes a first light emission region emit light and a first transparent insulation member that covers the first light emitting element; a second layer stacked on a light emission direction side of the first layer and including a second light emitting element that makes a second light emission region emit light and a second transparent insulation member that covers the second light emitting element; and a third layer stacked on the light emission direction side of the second layer and including a third light emitting element that makes a third light emission region, at least partially overlapping with the first light emission region and the second light emission region as viewed from the light emission direction, emit light and a third transparent insulation member that covers the third light emitting element, wherein the third light emitting element includes an indium gallium nitride-based light emitting layer and a gallium nitride-based cathode layer in contact with the light emitting layer and has lower luminous efficiency than the first light emitting element and the second light emitting element.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Modes for carrying out the invention (hereinafter referred to as embodiments) will be described below by using the drawings. Further scope of applicability of the present invention will become apparent from the detailed description given hereinafter. However, it should be understood that the detailed description and specific examples, while indicating preferred embodiments of the invention, are given by way of illustration only, since various changes and modifications will become apparent to those skilled in the art from the detailed description.

1. First Embodiment

1-1. Configuration of LED Display Device

Figure 1:
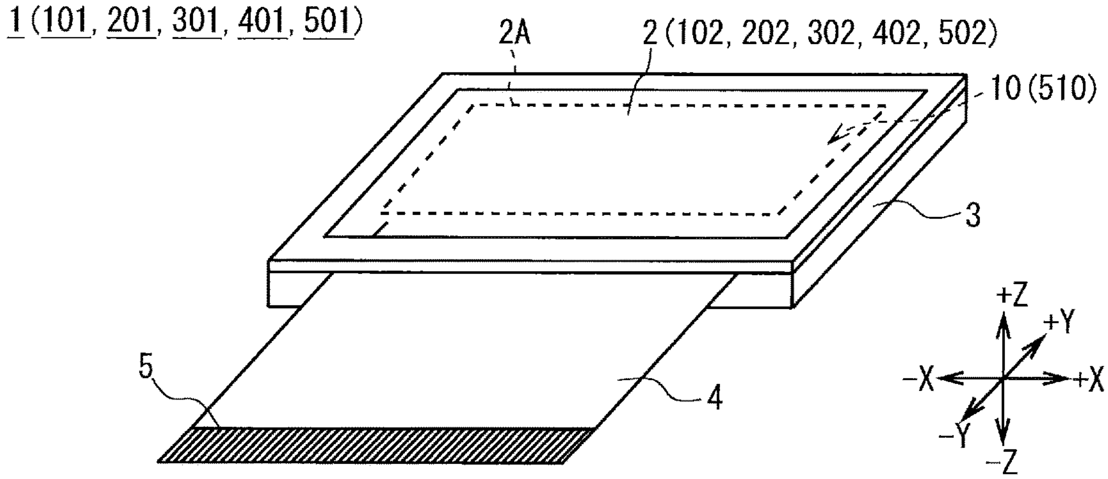
FIG. 1 is a perspective view showing the configuration of an LED display device.
Figure 2A:
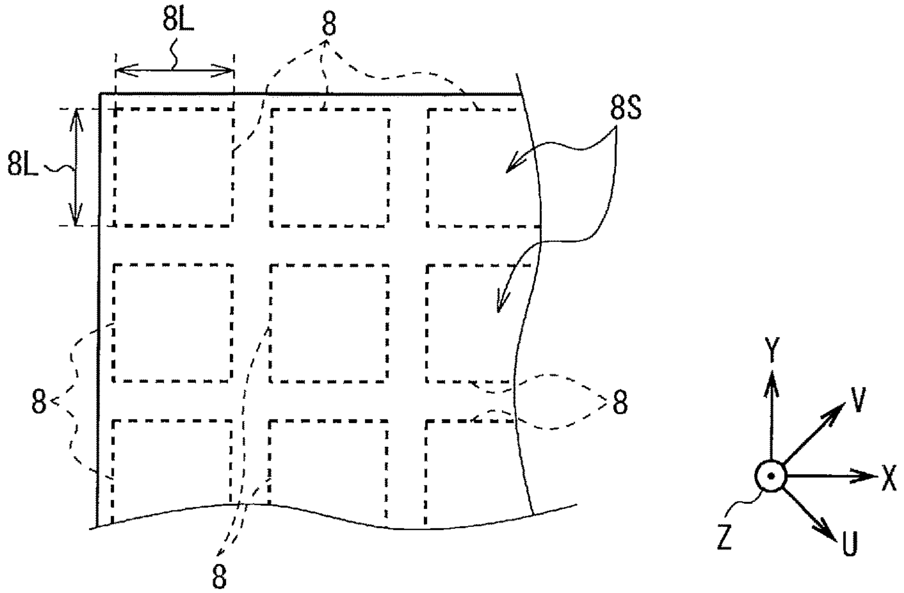
FIGS. 2A and 2B are a schematic plan view and a schematic side view showing the configuration of an LED display unit according to a first embodiment.
Figure 2B:
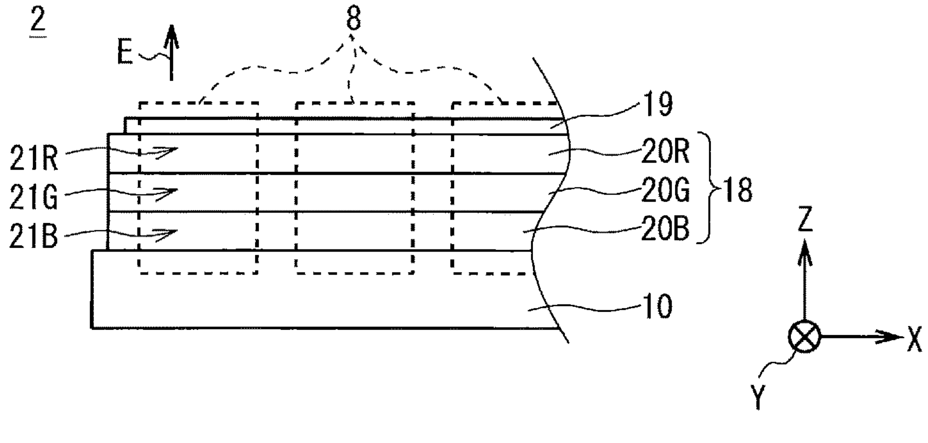

As shown in FIG. 1 and FIGS. 2A and 2B, an LED (Light Emitting Diode) display device 1 includes an LED display unit 2, a heat radiation member 3, a connection cable 4, a connection terminal part 5, and so forth. The LED display device 1 as a light emitting device, which is referred to also as a micro-LED display, is a display device in which one set of LED elements respectively emitting light of red color, green color and blue color is associated with one pixel.

As schematic diagrams are shown in FIGS. 2A and 2B, the LED display unit 2 has a configuration in which a thin-film layer set 18 is provided on a +Z direction-side surface (hereinafter referred to as a substrate front surface 10S) of a circuit board 10 in a flat plate-like shape and a common wiring layer 19 is stacked on a +Z direction-side surface of the thin-film layer set 18.

The circuit board 10 as a control board includes a wiring layer and drive elements, drive circuits, and so forth (not shown) connected to the wiring layer, and is a substrate electrically connected to LEDs of each pixel for selectively driving the LEDs. In the following description, a direction heading from the left to the right on the sheet of FIG. 1 is represented as a +X direction, a direction heading from the bottom left to the top right on the sheet is represented as a +Y direction, and a direction heading from the bottom to the top on the sheet is represented as a +Z direction. Further, in the following description, a surface on the +Z direction side of each part is referred to also as an upper surface, and a surface on the −Z direction side of each part is referred to also as a lower surface.

The thin-film layer set 18 has a configuration in which three thin-film layers 20: a first thin-film layer 20B, a second thin-film layer 20G and a third thin-film layer 20R, are successively stacked in the +Z direction. Further, in the thin-film layer set 18, a plurality of pixel units 8 forming the pixels are formed to be arrayed in the X direction and the Y direction like a lattice (like a matrix) in a display region 2A of the LED display unit 2. In other words, in the LED display unit 2, a plurality of pixel units 8 are arranged in an array in the X direction and the Y direction.

Each pixel unit 8 occupies a region in a square shape as viewed from the Z direction side, and the pixel units 8 are arranged in the X direction and the Y direction like a lattice. Specifically, the lengths of the pixel unit 8 in the X direction and the Y direction are both greater than or equal to 1 [mm], and the thickness of the pixel unit 8 in the Z direction (i.e., thickness of the thin-film layer set 18) is less than or equal to 100 [μm]. In the following description, a surface of the pixel unit 8 on the most Z direction side, that is, a surface from which light is emitted, is referred to also as a light emission surface 8S, and the length of one side of the pixel unit 8 in regard to the X direction or the Y direction is referred to also as a pixel length 8L.

As shown in FIG. 2B, in each pixel unit 8, a light emitting element 21B for emitting light of the blue color is formed in the first thin-film layer 20B, a light emitting element 21G for emitting light of the green color is formed in the second thin-film layer 20G, and a light emitting element 21R for emitting light of the red color is formed in the third thin-film layer 20R. Further, in each pixel unit 8, wirings or the like for respectively supplying electric power to the light emitting elements 21 (21B, 21G and 21R) are also formed. Each light emitting element 21 is formed as an inorganic light emitting diode and emits light in response to electric power supplied via the wiring or the like. With this configuration, each pixel unit 8 is capable of emitting light of a variety of colors and light amount in the Z direction from its light emission surface 8S (details will be described later).

As above, the LED display unit 2 is a display device formed by arraying a plurality of pixel units 8 like a matrix on the circuit board 10 as an active matrix circuit board, and an image can be displayed in the display region 2A by making each pixel unit 8 emit light of an intended color.

The heat radiation member 3 (FIG. 1) is formed in an overall flat rectangular solid shape with a metallic material having relatively high thermal conductivity such as aluminum, for example. This heat radiation member 3 is provided to be in contact with the LED display unit 2 on the −Z direction side of the LED display unit 2, namely, on the side opposite to the surface on which an image or the like is displayed, and thereby radiates heat from the circuit board 10. The connection cable 4 is electrically connected to a predetermined control device (not shown) via the connection terminal part 5, thereby conducts an image signal supplied from the control device, and supplies the image signal to the circuit board 10. Consequently, the LED display device 1 displays an image based on the image signal supplied from the control device (not shown) or the like, in the display region 2A of the LED display unit 2.

In the following description, a character "B" is added to the end of the reference character of a member related to the first thin-film layer 20B, a character "G" is added to the end of the reference character of a member related to the second thin-film layer 20G, and a character "R" is added to the end of the reference character of a member related to the third thin-film layer 20R. Further, in the following description, a direction that represents a direction in which the light emitted from the display region 2A of the LED display unit 2 mainly travels and that is orthogonal to the upper surface of the first thin-film layer 20B (i.e., the Z direction) is referred to also as a light emission direction E. Furthermore, in the following description, the direction in which the first thin-film layer 20B, the second thin-film layer 20G and the third thin-film layer 20R are stacked (i.e., the Z direction) is referred to also as a stacking direction.

1-2. Overall Configuration of LED Display Unit

Figure 3:
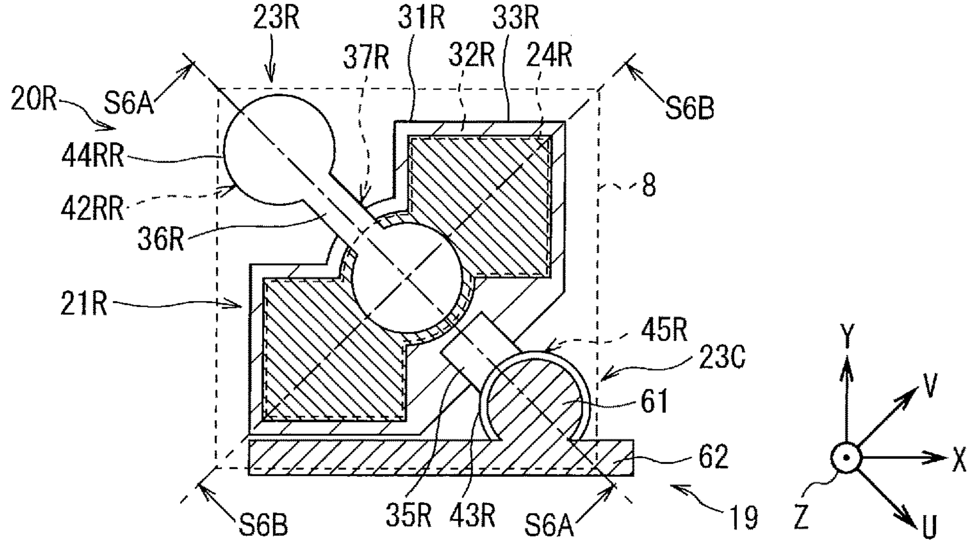
FIG. 3 is a schematic plan view showing the configuration of a third thin-film layer and a common wiring layer according to the first embodiment.
Figure 4:
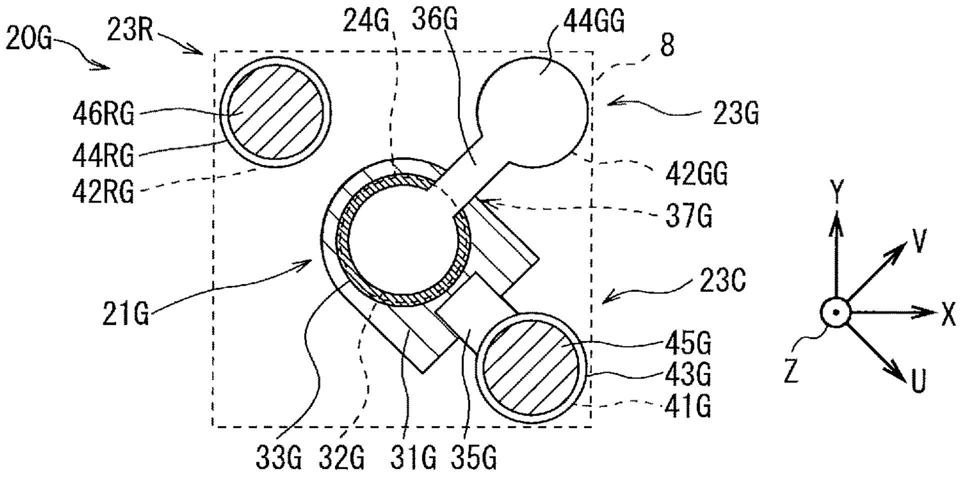
FIG. 4 is a schematic plan view showing the configuration of a second thin-film layer according to the first embodiment.
Figure 5:
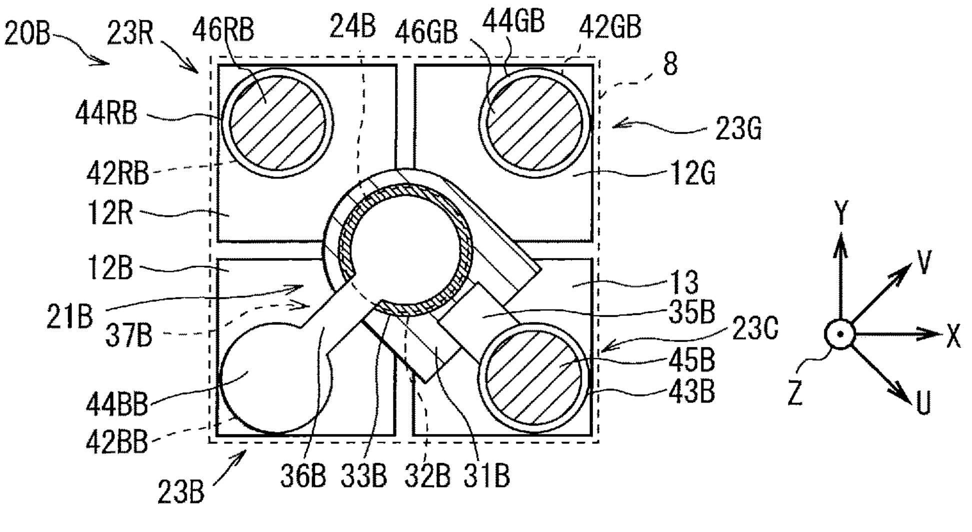
FIG. 5 is a schematic plan view showing the configuration of a first thin-film layer and a circuit board according to the first embodiment.
Figure 6A:
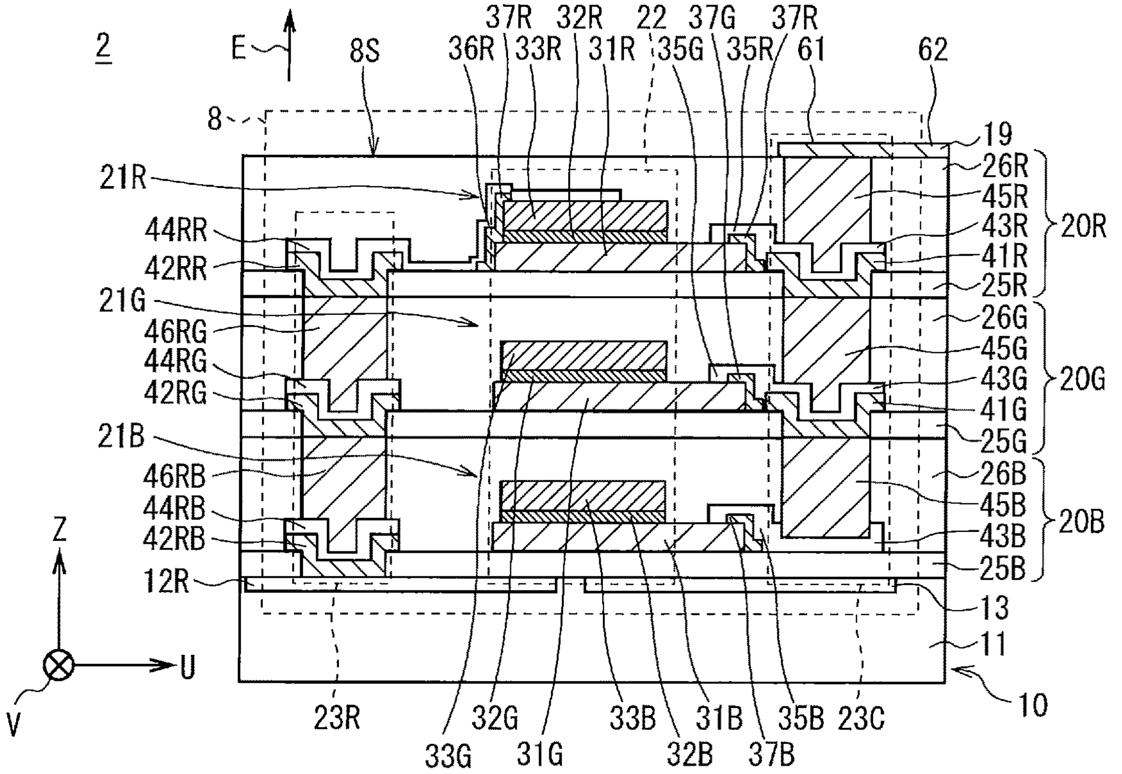
FIGS. 6A and 6B are schematic diagrams showing the configuration of the LED display unit according to the first embodiment, which are a cross-sectional view taken along the S6A-S6A arrow view cross section in FIG. 3 and a cross-sectional view taken along the S6B-S6B arrow view cross section in FIG. 3.
Figure 6B:
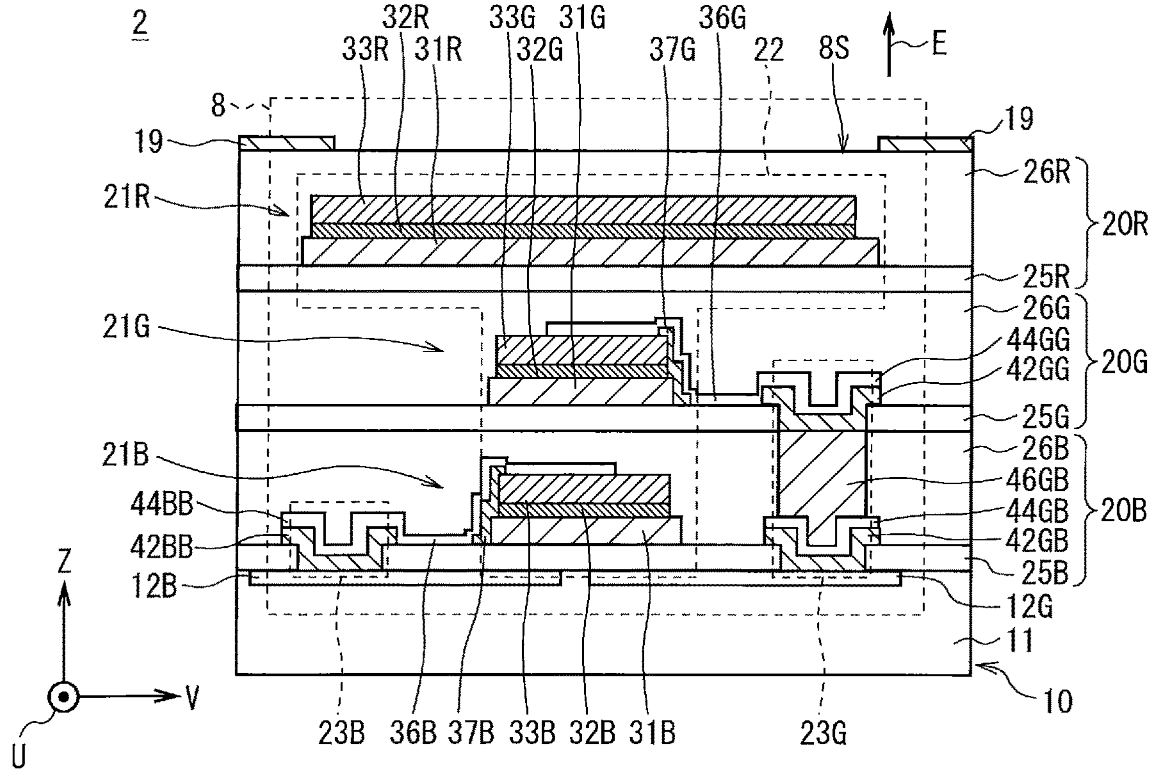

Next, a detailed configuration of the LED display unit 2 (FIGS. 2A and 2B) will be described below with reference to FIG. 3 to FIGS. 6A and 6B. FIG. 3 shows a schematic plan view of parts of the third thin-film layer 20R and the common wiring layer 19 corresponding to one pixel unit 8 as viewed from the +Z direction (i.e., as viewed from above in FIGS. 6A and 6B). FIG. 4 shows a schematic plan view of a part of the second thin-film layer 20G corresponding to one pixel unit 8 as viewed from the +Z direction (i.e., as viewed from above in FIGS. 6A and 6B). FIG. 5 shows a schematic plan view of parts of the first thin-film layer 20B and the circuit board 10 corresponding to one pixel unit 8 as viewed from the +Z direction (i.e., as viewed from above in FIGS. 6A and 6B). FIGS. 6A and 6B respectively show a cross-sectional view taken along the S6A-S6A arrow view cross section in FIG. 3 and a cross-sectional view taken along the S6B-S6B arrow view cross section in FIG. 3. The +Z direction is referred to also as the light emission direction. "As viewed from the +Z direction" and "as viewed from the light emission direction" mean "as an object is viewed from a position in the +Z direction from the object".

Further, in the following description, a direction heading exactly in between the +X direction and the −Y direction, namely, a direction along the S6A-S6A arrow view cross section in FIG. 3, is referred to as a U direction, and a direction heading in between the +X direction and the +Y direction, namely, a direction along the S6B-S6B arrow view cross section in FIG. 3, is referred to as a V direction.

As cross-sectional views are shown in FIGS. 6A and 6B, the circuit board 10 is a CMOS (Complementary Metal Oxide Semiconductor) back plane circuit board manufactured by a silicon process. This circuit board 10 is a multilayer structure formed with a plurality of types of materials, and includes insulation layers (not illustrated), circuit elements, wiring layers and so forth, in addition to a base material part 11, anode substrate pads 12 (anode substrate pads 12R, 12G and 12B) and dummy substrate pads 13.

The base material part 11 is mainly formed with silicon or the like, and is properly provided with the aforementioned insulation layers, elements, wiring layers and so forth (not shown). The anode substrate pads 12 (anode substrate pads 12B, 12G and 12R) and the dummy substrate pads 13 are situated on the most Z direction side in the circuit board 10, and each pad's surface on the Z direction side is a part of the substrate front surface 10S. One pixel unit 8 includes one anode substrate pad 12B, one anode substrate pad 12G, one anode substrate pad 12R and one dummy substrate pad 13. The anode substrate pads 12R, 12G and 12B and the dummy substrate pad 13 will hereinafter be referred to collectively as a substrate pad set 14.

Each substrate pad in the substrate pad set 14 is formed with an electrically conductive material such as gold, copper, aluminum, indium tin oxide, or the like. As viewed from the Z direction (i.e., as viewed from above in FIGS. 6A and 6B), each substrate pad is in a square shape with each side having a length approximately ½ of the pixel length 8L (FIGS. 2A and 2B) as shown in FIG. 5, and in one pixel unit 8, the substrate pads are arrayed like a matrix (i.e., like a lattice) with two substrate pads arrayed in the X direction and in the Y direction. In the substrate pad set 14, each anode substrate pad 12 excluding the dummy substrate pad 13 is electrically connected to a circuit element (not shown) by predetermined wiring members or the like inside the circuit board 10.

The anode substrate pad 12B (FIG. 5) is situated on the −X direction side and the −Y direction side, namely, on the −V direction side, in the pixel unit 8. Further, the anode substrate pad 12B is situated on the −Z direction side of a vertical direction wiring 23B (FIG. 6B), and the upper surface of the anode substrate pad 12B is in contact with and electrically connected to the lower surface of the vertical direction wiring 23B.

The anode substrate pad 12G (FIG. 5) is situated on the +X direction side and the +Y direction side, namely, on the +V direction side, in the pixel unit 8. Further, the anode substrate pad 12G is situated on the −Z direction side of a vertical direction wiring 23G (FIG. 6B), and the upper surface of the anode substrate pad 12G is in contact with and electrically connected to the lower surface of the vertical direction wiring 23G.

The anode substrate pad 12R (FIG. 5) is situated on the −X direction side and the +Y direction side, namely, on the −U direction side, in the pixel unit 8. Further, the anode substrate pad 12R is situated on the −Z direction side of a vertical direction wiring 23R (FIG. 6A), and the upper surface of the anode substrate pad 12R is in contact with and electrically connected to the lower surface of the vertical direction wiring 23R.

The dummy substrate pad 13 (FIG. 5) is situated on the +X direction side and the −Y direction side, namely, on the +U direction side, in the pixel unit 8. While the dummy substrate pad 13 is situated on the −Z direction side of a vertical direction wiring 23C (FIG. 6A), the dummy substrate pad 13 is insulated by an interlayer insulation layer 26B which will be described later. Therefore, the dummy substrate pad 13 is electrically connected to none of the first thin-film layer 20B, the second thin-film layer 20G and the third thin-film layer 20R.

Further, as mentioned earlier, the substrate front surface 10S of the circuit board 10 has been formed as an extremely flat plane. That is, on the circuit board 10, the upper surfaces of the base material part 11, the anode substrate pads 12B, 12G and 12R and the dummy substrate pads 13 are all extremely flat and are planes parallel to each other, and the distance (i.e., level difference) between each other in regard to the Z direction is also extremely small. In other words, the upper surfaces of the base material part 11, the anode substrate pads 12B, 12G and 12R and the dummy substrate pads 13 are situated on the same plane. Specifically, on the circuit board 10, surface roughness of the substrate front surface 10S, namely, surface roughness (referred to also as roughness or surface maximum level difference) Rpv on each of the upper surfaces of the base material part 11, the anode substrate pads 12B, 12G and 12R and the dummy substrate pads 13 is less than or equal to 10 [nm].

The common wiring layer 19 (FIG. 3 and FIGS. 6A and 6B) is formed with a material having electrical conductivity, formed like a thin film that is thin in the Z direction, and stacked on the upper surface of the third thin-film layer 20R. This common wiring layer 19 is made up of a cathode electrode part 61 provided at a position to be in contact with the vertical direction wiring 23C and an inter-pixel connection part 62 formed linearly in the X direction. The inter-pixel connection part 62 is connected to the cathode electrode part 61 in each pixel unit 8, and is also interconnected with the inter-pixel connection parts 62 of pixel units 8 adjoining in the X direction. Further, the inter-pixel connection part 62 is electrically connected with inter-pixel connection parts 62 adjoining in the Y direction outside the range of the display region 2A (FIG. 1), and is connected to a common cathode connection terminal of the circuit board 10.

1-3. Configuration of Thin-Film Layer Set

Next, a detailed configuration of the circuit board 10 and the thin-film layer set 18 in the LED display unit 2 will be described below while focusing on the pixel unit 8 as a region for one pixel.

1-3-1. Overall Configuration of Thin-Film Layer Set

As shown in FIG. 2B, the first thin-film layer 20B, the second thin-film layer 20G and the third thin-film layer 20R constituting the thin-film layer set 18 respectively include the light emitting elements 21B, 21G and 21R for emitting light of the blue color (B), the green color (G) and the red color (R), various wiring members, and so forth. Specifically, in the thin-film layer set 18, a dominant wavelength of the light of the red color emitted from the third thin-film layer 20R is longer than a dominant wavelength of the light of the blue color emitted from the first thin-film layer 20B and a dominant wavelength of the light of the green color emitted from the second thin-film layer 20G. In the following description, the first thin-film layer 20B as a first layer, the second thin-film layer 20G as a second layer and the third thin-film layer 20R as a third layer are collectively referred to also as thin-film layers 20.

Each thin-film layer 20 is formed like a sheet of film so that its lengths in the X direction and the Y direction are slightly greater than those of the display region 2A of the LED display unit 2 (FIG. 1) and its length (thickness) in the Z direction is extremely short (thin). Each thin-film layer 20's surfaces on the +Z direction side and the −Z direction side and the circuit board 10's surface on the +Z direction side (hereinafter referred to as the substrate front surface 10S) are all formed to be extremely flat.

Specifically, on all of these surfaces, the surface roughness (referred to also as the roughness or the surface maximum level difference) Rpv is less than or equal to 10 [nm]. Therefore, in the LED display unit 2, the interface between the circuit board 10 and the first thin-film layer 20B, the interface between the first thin-film layer 20B and the second thin-film layer 20G and the interface between the second thin-film layer 20G and the third thin-film layer 20R are all joined by intermolecular force, and parts having the electrical conductivity are connected to each other also electrically at each of the surfaces.

As described above, in each of the first thin-film layer 20B, the second thin-film layer 20G and the third thin-film layer 20R, the light emitting elements 21B, 21G, 21R formed at positions corresponding respectively to the pixel units 8 are arranged like a lattice in the X direction and the Y direction. In other words, in the LED display unit 2, in each of the thin-film layers 20 constituting the thin-film layer set 18, the pixels in the whole range of the display region 2A are arrayed like a lattice in one thin-film layer 20, not in a configuration in which the thin-film layers 20 are independent of each other pixel by pixel. In the following description, the light emitting elements 21B, 21G and 21R are collectively referred to also as a light emitting unit 22.

Further, the light emitting unit 22 is arranged so that centers of the light emitting elements 21B, 21G and 21R substantially coincide with each other as viewed from the Z direction (i.e., as viewed from above in FIGS. 6A and 6B), and the centers are situated substantially at the center of the pixel unit 8, that is, substantially at the center of the pixel unit 8 in regard to the X direction and the Y direction. Each of the light emitting elements 21B, 21G and 21R is formed as an LED in a shape like a thin film and includes an anode and a cathode (details will be described later).

Further, as shown in FIG. 3 to FIGS. 6A and 6B, in each pixel unit 8, the vertical direction wirings 23B, 23G, 23R and 23C (hereinafter referred to collectively as vertical direction wirings 23) are provided at four positions in a periphery of the light emitting unit 22. Each vertical direction wiring 23 is formed in a cylindrical shape having a central axis in the Z direction, and has the electrical conductivity as a whole since a plurality of layers each having the electrical conductivity are properly stacked in the Z direction. Each vertical direction wiring 23 is hereinafter referred to also as a conductive column.

The vertical direction wiring 23B as a first conductive column is situated on the −V direction side of the light emitting unit 22, provided in the first thin-film layer 20B, and electrically connects the anode substrate pad 12B of the circuit board 10 and the anode of the light emitting element 21B to each other. The vertical direction wiring 23G as a second conductive column is situated on the +V direction side of the light emitting unit 22, provided in the first thin-film layer 20B and the second thin-film layer 20G to extend across the interface between these layers, and electrically connects the anode substrate pad 12G of the circuit board 10 and the anode of the light emitting element 21G to each other.

The vertical direction wiring 23R as a third conductive column is situated on the −U direction side of the light emitting unit 22, provided in the first thin-film layer 20B, the second thin-film layer 20G and the third thin-film layer 20R to extend across the interfaces between these layers, and electrically connects the anode substrate pad 12R of the circuit board 10 and the anode of the light emitting element 21R to each other. That is, the vertical direction wirings 23B, 23G and 23R electrically connect the circuit board 10 respectively to the first thin-film layer 20B, the second thin-film layer 20G and the third thin-film layer 20R.

The vertical direction wiring 23C is situated on the +U direction side of the light emitting unit 22, provided in the first thin-film layer 20B, the second thin-film layer 20G and the third thin-film layer 20R to extend across the interfaces between these layers, and electrically connects the common wiring layer 19 formed on the upper surface's side of the third thin-film layer 20R and the cathodes of the light emitting elements 21B, 21G and 21R to each other. That is, the vertical direction wiring 23C functions as a common terminal (so-called "common") electrically interconnected so as to penetrate the first thin-film layer 20B, the second thin-film layer 20G and the third thin-film layer 20R.

As above, each pixel unit 8 is configured so that the electric power supplied via the circuit board 10 and the common wiring layer 19 is supplied respectively to the light emitting elements 21B, 21G and 21R by the four vertical direction wirings 23.

1-3-2. Configuration of First Thin-Film Layer

As shown in FIG. 5 and FIGS. 6A and 6B, the first thin-film layer 20B includes a base insulation layer 25B, the interlayer insulation layer 26B and so forth in addition to the above-described parts forming the light emitting element 21B and the vertical direction wirings 23. Further, in the first thin-film layer 20B, the light emitting element 21B is made up of a cathode layer 31B, a light emitting layer 32B and an anode layer 33B, and the first thin-film layer 20B includes a cathode lead wiring 35B, an anode lead wiring 36B and an insulation layer 37B as parts highly relevant to the light emitting unit 22.

Further, the first thin-film layer 20B includes anode electrode pads 42BB, 42GB and 42RB, a cathode wiring pad 43B, anode wiring pads 44BB, 44GB and 44RB, a cathode pillar 45B, and anode pillars 46GB and 46RB as parts mainly relevant to the vertical direction wirings 23.

The base insulation layer 25B (FIGS. 6A and 6B), which is referred to also as a base layer, is formed with, for example, a transparent insulating material made of an organic insulating material such as polyimide resin, epoxy resin or acrylic resin or an inorganic insulating material such as $SiO_2$ or SiN, and has a sufficient insulating property. While this base insulation layer 25B is formed in a shape like a uniformly flat thin film as a whole, round holes penetrating the base insulation layer 25B in the Z direction are respectively formed at three positions on the −V direction side, the +U direction side and the +V direction side of the light emitting element 21B, namely, in parts corresponding to the aforementioned vertical direction wirings 23B, 23G and 23R.

The light emitting element 21B as a first light emitting element includes the cathode layer 31B, the light emitting layer 32B and the anode layer 33B successively stacked on the +Z direction side of the base insulation layer 25B, is formed as a thin film whose thickness in the Z direction is less than or equal to 3 [μm], and forms a thin-film inorganic LED as a whole. Each of the cathode layer 31B, the light emitting layer 32B and the anode layer 33B is formed in a shape like a thin film with flat upper surface and lower surface, as a single layer or a plurality of layers including a material such as GaN (gallium nitride), AlGaN or InGaN (indium gallium nitride). Further, the length (thickness) of the light emitting layer 32B in regard to the Z direction is sufficiently short (thin) in comparison with the cathode layer 31B and the anode layer 33B.

The light emitting layer 32B and the anode layer 33B (FIG. 5) are formed in circular shapes as viewed from the Z direction (i.e., as viewed from above in FIGS. 6A and 6B), and are situated substantially at the center of the pixel unit 8 in regard to the X direction and the Y direction. The diameter of the circle is approximately ⅓ of the pixel length 8L (FIGS. 2A and 2B). The cathode layer 31B, as viewed from the Z direction (i.e., as viewed from above in FIGS. 6A and 6B), is in a shape as a combination of a part in a circular shape one size larger than the light emitting layer 32B and the anode layer 33B and a part in a rectangular shape surrounded by sides in the U direction and a side in the V direction on the +U direction side of the circle.

The cathode lead wiring 35B is formed as, for example, a transparent conductive film formed with a material such as ITO (Indium Tin Oxide) or a single layer or a multilayer structure of a plurality of layers made with metal such as Au, Al, Pt or Ti or alloy of such metals. This cathode lead wiring 35B is formed to connect the light emitting element 21B and the vertical direction wiring 23C to each other approximately in the U direction.

Specifically, the cathode lead wiring 35B is electrically connected to the cathode layer 31B on the light emitting element 21B's side. Further, the cathode lead wiring 35B is formed integrally with the cathode wiring pad 43B on the vertical direction wiring 23C's side, and is electrically connected to the cathode pillar 45B via the cathode wiring pad 43B.

Similarly to the cathode lead wiring 35B, the anode lead wiring 36B is formed as, for example, a transparent conductive film formed with a material such as ITO or a single layer or a multilayer structure of a plurality of layers made with metal such as Au, Al, Pt or Ti or alloy of such metals. This anode lead wiring 36B is formed to connect the light emitting element 21B and the vertical direction wiring 23B on the −V direction side of the light emitting element 21B to each other approximately in the V direction.

Specifically, the anode lead wiring 36B is formed to cover the upper surface of the anode layer 33B on the light emitting element 21B's side and is electrically connected to the anode layer 33B. Further, the anode lead wiring 36B is formed integrally with the anode wiring pad 44BB on the vertical direction wiring 23B's side and is electrically connected to the anode electrode pad 42BB via the anode wiring pad 44BB.

The insulation layer 37B is formed as an organic insulation film or an inorganic insulation film, for example, and has an electrically insulating property. This insulation layer 37B electrically insulates the cathode lead wiring 35B and the cathode layer 31B from each other to prevent short-circuiting, while also electrically insulating the anode lead wiring 36B from the cathode layer 31B, the light emitting layer 32B and the anode layer 33B to prevent short-circuiting.

The interlayer insulation layer 26B as a first transparent insulation member is formed to fill in a part on the +Z direction side of the light emitting element 21B, the cathode lead wiring 35B and the anode lead wiring 36B. This interlayer insulation layer 26B is formed as an organic film or an inorganic film having a property of allowing visible light to pass through, and has the electrically insulating property. The upper surface of the interlayer insulation layer 26B is formed to be extremely flat and its surface roughness Rpv is less than or equal to 10 [nm].

Each of the anode electrode pads 42BB, 42GB and 42RB is formed as, for example, a single layer or a multilayer structure of a plurality of layers made with metal such as Au, Al, Pt or Ti or alloy of such metals, and has the electrical conductivity. Further, the anode electrode pads 42BB, 42GB and 42RB are formed to respectively cover the three round holes formed through the base insulation layer 25B, and the lower surfaces of the anode electrode pads 42BB, 42GB and 42RB form a plane that is the same as the lower surface of the base insulation layer 25B. These anode electrode pads 42BB, 42GB and 42RB have their lower surfaces be respectively in contact with and electrically connected to the anode substrate pads 12B, 12G and 12R of the circuit board 10, while also having their upper surfaces be respectively in contact with and electrically connected to the anode wiring pads 44BB, 44GB and 44RB.

The cathode wiring pad 43B is a part of the cathode lead wiring 35B, is formed as a thin-film layer made with the same material as the cathode lead wiring 35B, and forms a part of the vertical direction wiring 23C. This cathode wiring pad 43B has its lower surface be in contact with the base insulation layer 25B to be insulated, while having its upper surface be in contact with and electrically connected to the cathode pillar 45B.

The anode wiring pad 44BB is a part of the anode lead wiring 36B and is formed as a thin-film layer made with the same material as the anode lead wiring 36B to cover the upper surface of the anode electrode pad 42BB. This anode wiring pad 44BB has its lower surface be in contact with and electrically connected to the anode electrode pad 42BB, while having its upper surface be covered by the interlayer insulation layer 26B and electrically insulated.

The anode wiring pads 44GB and 44RB are thin-film layers formed with the same material as the anode wiring pad 44BB, and are formed to respectively cover the upper surfaces of the anode electrode pads 42GB and 42RB. These anode wiring pads 44GB and 44RB have their lower surfaces be respectively in contact with and electrically connected to the anode electrode pads 42GB and 42RB, while also having their upper surfaces be respectively in contact with and electrically connected to the anode pillars 46GB and 46RB.

The cathode pillar 45B is formed in a cylindrical shape having a central axis in the Z direction and is configured as, for example, a single layer or a multilayer structure of a plurality of layers made with metal such as Cu, Ni or Ti or alloy of such metals. This cathode pillar 45B has its lower surface be in contact with and electrically connected to the cathode wiring pad 43B. Further, the cathode pillar 45B's upper surface forms a plane that is the same as the upper surface of the interlayer insulation layer 26B, and the cathode pillar 45B has the upper surface be in contact with and electrically connected to a cathode electrode pad 41G (details will be described later) provided on the second thin-film layer 20G.

Similarly to the cathode pillar 45B, each of the anode pillars 46GB and 46RB is formed in a cylindrical shape having a central axis in the Z direction and is configured as, for example, a single layer or a multilayer structure of a plurality of layers made with metal such as Cu, Ni or Ti or alloy of such metals. These anode pillars 46GB and 46RB have their lower surfaces be respectively in contact with and electrically connected to the anode wiring pads 44GB and 44RB. Further, the upper surfaces of the anode pillars 46GB and 46RB form a plane that is the same as the upper surface of the interlayer insulation layer 26B, and the anode pillars 46GB and 46RB have the upper surfaces be respectively in contact with and electrically connected to anode electrode pads 42GG and 42RG (details will be described later) provided on the second thin-film layer 20G.

The first thin-film layer 20B configured as above makes the light emitting element 21B function as a light emitting element of the blue color by supplying electric power to the light emitting element 21B via the vertical direction wirings 23C and 23B. In this case, the light emitting element 21B emits light whose wavelength is 400-490 [nm], for example, namely, light of the blue color, by making a range corresponding to the light emitting layer 32B as viewed from the Z direction (i.e., as viewed from above in FIGS. 6A and 6B), namely, a light emission region 24B (FIG. 5), emit light. Further, the first thin-film layer 20B electrically connects the anode substrate pads 12G and 12R of the circuit board 10 respectively to the anode electrode pads 42GG and 42RG provided on the second thin-film layer 20G by the vertical direction wirings 23G and 23R and thereby relays the supply of the electric power. The light emission region 24B is hereinafter referred to also as a first light emission region.

1-3-3. Configuration of Second Thin-Film Layer

As shown in FIG. 4 and FIGS. 6A and 6B, the second thin-film layer 20G has a configuration that is overall similar to but partially different from the configuration of the first thin-film layer 20B (FIG. 5). Specifically, the second thin-film layer 20G includes a base insulation layer 25G, an interlayer insulation layer 26G and so forth in addition to the above-described parts forming the light emitting element 21G and the vertical direction wirings 23. Further, in the second thin-film layer 20G, the light emitting element 21G is made up of a cathode layer 31G, a light emitting layer 32G and an anode layer 33G, and the second thin-film layer 20G includes a cathode lead wiring 35G, an anode lead wiring 36G and an insulation layer 37G as parts highly relevant to the light emitting unit 22.

Further, the second thin-film layer 20G includes the cathode electrode pad 41G, the anode electrode pads 42GG and 42RG, a cathode wiring pad 43G, anode wiring pads 44GG and 44RG, a cathode pillar 45G, and an anode pillar 46RG, as parts mainly relevant to the vertical direction wirings 23.

The base insulation layer 25G (FIGS. 6A and 6B), which is referred to also as a base layer, is formed with, for example, a transparent insulating material made of an organic insulating material such as polyimide resin, epoxy resin or acrylic resin or an inorganic insulating material such as $SiO_2$ or SiN, and has a sufficient insulating property. While this base insulation layer 25G is formed in a shape like a uniformly flat thin film as a whole, round holes penetrating the base insulation layer 25G in the Z direction are respectively formed at three positions on the +V direction side, the −U direction side and the +U direction side of the light emitting element 21G, namely, in parts corresponding to the aforementioned vertical direction wirings 23G, 23R and 23C.

The light emitting element 21G as a second light emitting element includes the cathode layer 31G, the light emitting layer 32G and the anode layer 33G successively stacked on the +Z direction side of the base insulation layer 25G, is formed as a thin film whose thickness in the Z direction is less than or equal to 3 [μm], and forms a thin-film inorganic LED as a whole. Each of the cathode layer 31G, the light emitting layer 32G and the anode layer 33G is formed in a shape like a thin film with flat upper surface and lower surface, as a single layer or a plurality of layers including a material such as GaN, AlGaN or InGaN.

The light emitting layer 32G and the anode layer 33G (FIG. 4) are formed in circular shapes as viewed from the Z direction (i.e., as viewed from above in FIGS. 6A and 6B), and are situated substantially at the center of the pixel unit 8 in regard to the X direction and the Y direction. The cathode layer 31G, as viewed from the Z direction (i.e., as viewed from above in FIGS. 6A and 6B), is in a shape as a combination of a part in a circular shape one size larger than the light emitting layer 32G and the anode layer 33G and a part in a rectangular shape surrounded by sides in the U direction and a side in the V direction on the +U direction side of the circle.

The cathode lead wiring 35G is formed as, for example, a transparent conductive film formed with a material such as ITO or a single layer or a multilayer structure of a plurality of layers made with metal such as Au, Al, Pt or Ti or alloy of such metals. This cathode lead wiring 35G is formed to connect the light emitting element 21G and the vertical direction wiring 23C to each other approximately in the U direction.

Specifically, the cathode lead wiring 35G is electrically connected to the cathode layer 31G on the light emitting element 21G's side. Further, the cathode lead wiring 35G is formed integrally with the cathode wiring pad 43G on the vertical direction wiring 23C's side and is electrically connected to the cathode electrode pad 41G and the cathode pillar 45G via the cathode wiring pad 43G.

Similarly to the cathode lead wiring 35G, the anode lead wiring 36G is formed as, for example, a transparent conductive film formed with a material such as ITO or a single layer or a multilayer structure of a plurality of layers made with metal such as Au, Al, Pt or Ti or alloy of such metals. This anode lead wiring 36G is formed to connect the light emitting element 21G and the vertical direction wiring 23G on the +V direction side of the light emitting element 21G to each other approximately in the V direction.

Specifically, the anode lead wiring 36G is formed to cover the upper surface of the anode layer 33G on the light emitting element 21G's side and is electrically connected to the anode layer 33G. Further, the anode lead wiring 36G is formed integrally with the anode wiring pad 44GG on the vertical direction wiring 23G's side and is electrically connected to the anode electrode pad 42GG via the anode wiring pad 44GG.

The insulation layer 37G is formed as an organic insulation film or an inorganic insulation film, for example, and has the electrically insulating property. This insulation layer 37G electrically insulates the cathode lead wiring 35G and the cathode layer 31G from each other to prevent short-circuiting, while also electrically insulating the anode lead wiring 36G from the cathode layer 31G, the light emitting layer 32G and the anode layer 33G to prevent short-circuiting.

The interlayer insulation layer 26G as a second transparent insulation member is formed to fill in a part on the +Z direction side of the light emitting element 21G, the cathode lead wiring 35G and the anode lead wiring 36G. This interlayer insulation layer 26G is formed as an organic film or an inorganic film having the property of allowing visible light to pass through, and has the electrically insulating property. The upper surface of the interlayer insulation layer 26G is formed to be extremely flat and its surface roughness Rpv is less than or equal to 10 [nm].

The cathode electrode pad 41G is formed as, for example, a single layer or a multilayer structure of a plurality of layers made with metal such as Au, Al, Pt or Ti or alloy of such metals, and has the electrical conductivity. Further, the cathode electrode pad 41G is formed to cover the round hole on the +U direction side formed through the base insulation layer 25G, and the lower surface of the cathode electrode pad 41G forms a plane that is the same as the lower surface of the base insulation layer 25G. This cathode electrode pad 41G has its lower surface be in contact with and electrically connected to the upper surface of the cathode pillar 45B in the first thin-film layer 20B, while also having its upper surface be in contact with and electrically connected to the cathode wiring pad 43G.

Each of the anode electrode pads 42GG and 42RG is formed as, for example, a single layer or a multilayer structure of a plurality of layers made with metal such as Au, Al, Pt or Ti or alloy of such metals, and has the electrical conductivity. Further, the anode electrode pads 42GG and 42RG are formed to respectively cover the round holes on the +V direction side and the −U direction side formed through the base insulation layer 25G, and the lower surfaces of the anode electrode pads 42GG and 42RG form a plane that is the same as the lower surface of the base insulation layer 25G. These anode electrode pads 42GG and 42RG have their lower surfaces be respectively in contact with and electrically connected to the upper surfaces of the anode pillars 46GB and 46RB in the first thin-film layer 20B, while also having their upper surfaces be respectively in contact with and electrically connected to the anode wiring pads 44GG and 44RG.

The cathode wiring pad 43G is a part of the cathode lead wiring 35G, is formed as a thin-film layer made with the same material as the cathode lead wiring 35G, and forms a part of the vertical direction wiring 23C. This cathode wiring pad 43G has its lower surface be in contact with and electrically connected to the cathode electrode pad 41G, while also having its upper surface be in contact with and electrically connected to the cathode pillar 45G.

The anode wiring pad 44GG is a part of the anode lead wiring 36G and is formed as a thin-film layer made with the same material as the anode lead wiring 36G to cover the upper surface of the anode electrode pad 42GG. This anode wiring pad 44GG has its lower surface be in contact with and electrically connected to the anode electrode pad 42GG, while having its upper surface be covered by the interlayer insulation layer 26G and electrically insulated.

The anode wiring pad 44RG is a thin-film layer formed with the same material as the anode wiring pad 44GG, and is formed to cover the upper surface of the anode electrode pad 42RG. This anode wiring pad 44RG has its lower surface be in contact with and electrically connected to the anode electrode pad 42RG, while also having its upper surface be in contact with and electrically connected to the anode pillar 46RG.

The cathode pillar 45G is formed in a cylindrical shape having a central axis in the Z direction and is configured as, for example, a single layer or a multilayer structure of a plurality of layers made with metal such as Cu, Ni or Ti or alloy of such metals. This cathode pillar 45G has its lower surface be in contact with and electrically connected to the cathode wiring pad 43G. Further, the cathode pillar 45G has its upper surface forming a plane that is the same as the upper surface of the interlayer insulation layer 26G, and the cathode pillar 45G has the upper surface be in contact with and electrically connected to a cathode electrode pad 41R (details will be described later) provided on the third thin-film layer 20R.

Similarly to the cathode pillar 45G, the anode pillar 46RG is formed in a cylindrical shape having a central axis in the Z direction and is configured as, for example, a single layer or a multilayer structure of a plurality of layers made with metal such as Cu, Ni or Ti or alloy of such metals. This anode pillar 46RG has its lower surface be in contact with and electrically connected to the anode wiring pad 44RG. Further, the anode pillar 46RG has its upper surface forming a plane that is the same as the upper surface of the interlayer insulation layer 26G, and the anode pillar 46RG has the upper surface be in contact with and electrically connected to an anode electrode pad 42RR (details will be described later) provided on the third thin-film layer 20R.

The second thin-film layer 20G configured as above makes the light emitting element 21G function as a light emitting element of the green color by supplying electric power to the light emitting element 21G via the vertical direction wirings 23C and 23G. In this case, the light emitting element 21G emits light whose wavelength is 491 [nm] to 600 [nm], for example, namely, light of the green color, by making a range corresponding to the light emitting layer 32G as viewed from the Z direction (i.e., as viewed from above in FIGS. 6A and 6B), namely, a light emission region 24G (FIG. 4), emit light. Further, the second thin-film layer 20G electrically connects the anode pillar 46RB of the first thin-film layer 20B to the anode electrode pad 42RR of the third thin-film layer 20R by the vertical direction wirings 23R and thereby relays the supply of the electric power. The light emission region 24G is hereinafter referred to also as a second light emission region.

1-3-4. Configuration of Third Thin-Film Layer

As shown in FIG. 3 and FIGS. 6A and 6B, the third thin-film layer 20R has a configuration that is overall similar to but partially different from the configuration of the first thin-film layer 20B (FIG. 5). Specifically, the third thin-film layer 20R includes a base insulation layer 25R, an interlayer insulation layer 26R and so forth in addition to the above-described parts forming the light emitting element 21R and the vertical direction wirings 23. Further, in the third thin-film layer 20R, the light emitting element 21R is made up of a cathode layer 31R, a light emitting layer 32R and an anode layer 33R, and the third thin-film layer 20R includes a cathode lead wiring 35R, an anode lead wiring 36R and an insulation layer 37R as parts highly relevant to the light emitting unit 22.

Further, the third thin-film layer 20R includes the cathode electrode pad 41R, the anode electrode pad 42RR, a cathode wiring pad 43R, an anode wiring pad 44RR, and a cathode pillar 45R as parts mainly relevant to the vertical direction wirings 23.

The base insulation layer 25R (FIGS. 6A and 6B), which is referred to also as a base layer, is formed with, for example, a transparent insulating material made of an organic insulating material such as polyimide resin, epoxy resin or acrylic resin or an inorganic insulating material such as $SiO_2$ or SiN, and has a sufficient insulating property. While this base insulation layer 25R is formed in a shape like a uniformly flat thin film as a whole, round holes penetrating the base insulation layer 25R in the Z direction are respectively formed at two positions on the −U direction side and the +U direction side of the light emitting element 21R, namely, in parts corresponding to the aforementioned vertical direction wirings 23R and 23C.

The light emitting element 21R as a third light emitting element includes the cathode layer 31R, the light emitting layer 32R and the anode layer 33R successively stacked on the +Z direction side of the base insulation layer 25R, is formed as a thin film whose thickness in the Z direction is less than or equal to 3 [μm], and forms a thin-film inorganic LED as a whole. Each of the cathode layer 31R, the light emitting layer 32R and the anode layer 33R is formed in a shape like a thin film with flat upper surface and lower surface, as a single layer or a plurality of layers. Among these layers, the light emitting layer 32R is formed with a semiconductor including a gallium nitride-based material such as InGaN. Each of the cathode layer 31R and the anode layer 33R is formed with a material whose light absorption rate is relatively low such as GaN. Incidentally, all of the cathode layer 31R, the light emitting layer 32R and the anode layer 33R may be formed by using a material such as GaN, AlGaN or InGaN.

Each of the light emitting layer 32R and the anode layer 33R (FIG. 3), as viewed from the Z direction (i.e., as viewed from above in FIGS. 6A and 6B), is formed in a shape like a combination of a part in a circular shape situated substantially at the center of the pixel unit 8 in regard to the X direction and the Y direction and parts in square shapes respectively situated on the +V direction side and the −V direction side of the circle. The length of the diameter of the part in the circular shape is approximately ⅓ of the pixel length 8L (FIGS. 2A and 2B) similarly to the light emitting layer 32B and the anode layer 33B of the light emitting element 21B (FIG. 5) and the light emitting layer 32G and the anode layer 33G of the light emitting element 21G (FIG. 4). Further, the length of each side of the square-shaped parts of the light emitting layer 32R and the anode layer 33R is approximately ½ to ⅓ of the pixel length 8L. Furthermore, parts of the square-shaped parts are situated on the Z direction side (i.e., upper side) of the vertical direction wirings 23B and 23G as shown in FIG. 6B. The cathode layer 31R is in a shape like that obtained by enlarging the light emitting layer 32R and the anode layer 33R by one size and further slightly expanding them towards the U direction side.

As above, the light emitting element 21R is formed at a position and in a shape to totally cover the light emitting elements 21B (FIG. 5) and 21G (FIG. 4) as viewed from the Z direction side. Further, the area of contact between the cathode layer 31R and the light emitting layer 32R in the light emitting element 21R is larger than the area of contact between the cathode layer 31B and the light emitting layer 32B in the light emitting element 21B and the area of contact between the cathode layer 31G and the light emitting layer 32G in the light emitting element 21G. Furthermore, the area of contact between the light emitting layer 32R and the anode layer 33R in the light emitting element 21R is larger than the area of contact between the light emitting layer 32B and the anode layer 33B in the light emitting element 21B and the area of contact between the light emitting layer 32G and the anode layer 33G in the light emitting element 21G.

The cathode lead wiring 35R is formed as, for example, a transparent conductive film formed with a material such as ITO or a single layer or a multilayer structure of a plurality of layers made with metal such as Au, Al, Pt or Ti or alloy of such metals. This cathode lead wiring 35R is formed to connect the light emitting element 21R and the vertical direction wiring 23C to each other approximately in the U direction.

Specifically, the cathode lead wiring 35R is electrically connected to the cathode layer 31R on the light emitting element 21R's side. Further, the cathode lead wiring 35R is formed integrally with the cathode wiring pad 43R on the vertical direction wiring 23C's side and is electrically connected to the cathode electrode pad 41R and the cathode pillar 45R via the cathode wiring pad 43R.

Similarly to the cathode lead wiring 35R, the anode lead wiring 36R is formed as, for example, a transparent conductive film formed with a material such as ITO or a single layer or a multilayer structure of a plurality of layers made with metal such as Au, Al, Pt or Ti or alloy of such metals. This anode lead wiring 36R is formed to connect the light emitting element 21R and the vertical direction wiring 23R on the −U direction side of the light emitting element 21R to each other approximately in the U direction.

Specifically, the anode lead wiring 36R is formed to cover the upper side of the circular part of the anode layer 33R on the light emitting element 21R's side and is electrically connected to the anode layer 33R. Further, the anode lead wiring 36R is formed integrally with the anode wiring pad 44RR on the vertical direction wiring 23R's side and is electrically connected to the anode electrode pad 42RR via the anode wiring pad 44RR.

The insulation layer 37R is formed as an organic insulation film or an inorganic insulation film, for example, and has the electrically insulating property. This insulation layer 37R electrically insulates the cathode lead wiring 35R and the cathode layer 31R from each other to prevent short-circuiting, while also electrically insulating the anode lead wiring 36R from the cathode layer 31R, the light emitting layer 32R and the anode layer 33R to prevent short-circuiting.

The interlayer insulation layer 26R as a third transparent insulation member is formed to fill in a part on the +Z direction side of the light emitting element 21R, the cathode lead wiring 35R and the anode lead wiring 36R. This interlayer insulation layer 26R is formed as an organic film or an inorganic film having the property of allowing visible light to pass through, and has the electrically insulating property. The upper surface of the interlayer insulation layer 26R is formed to be extremely flat and its surface roughness Rpv is less than or equal to 10 [nm].

The cathode electrode pad 41R is formed as, for example, a single layer or a multilayer structure of a plurality of layers made with metal such as Au, Al, Pt or Ti or alloy of such metals, and has the electrical conductivity. Further, the cathode electrode pad 41R is formed to cover the round hole on the +U direction side formed through the base insulation layer 25R, and the lower surface of the cathode electrode pad 41R forms a plane that is the same as the lower surface of the base insulation layer 25R. This cathode electrode pad 41R has its lower surface be in contact with and electrically connected to the upper surface of the cathode pillar 45G in the second thin-film layer 20G, while also having its upper surface be in contact with and electrically connected to the cathode wiring pad 43R.

The anode electrode pad 42RR is formed as, for example, a single layer or a multilayer structure of a plurality of layers made with metal such as Au, Al, Pt or Ti or alloy of such metals, and has the electrical conductivity. Further, the anode electrode pad 42RR is formed to cover the round hole on the −U direction side formed through the base insulation layer 25R, and the lower surface of the anode electrode pad 42RR forms a plane that is the same as the lower surface of the base insulation layer 25R. This anode electrode pad 42RR has its lower surface be in contact with and electrically connected to the upper surface of the anode pillar 46RG in the second thin-film layer 20G, while also having its upper surface be in contact with and electrically connected to the anode wiring pad 44RR.

The cathode wiring pad 43R is a part of the cathode lead wiring 35R, is formed as a thin-film layer made with the same material as the cathode lead wiring 35R, and forms a part of the vertical direction wiring 23C. This cathode wiring pad 43R has its lower surface be in contact with and electrically connected to the cathode electrode pad 41R, while also having its upper surface be in contact with and electrically connected to the cathode pillar 45R.

The anode wiring pad 44RR is a part of the anode lead wiring 36R and is formed as a thin-film layer made with the same material as the anode lead wiring 36R to cover the upper surface of the anode electrode pad 42RR. This anode wiring pad 44RR has its lower surface be in contact with and electrically connected to the anode electrode pad 42RR, while having its upper surface be covered by the interlayer insulation layer 26R and electrically insulated.

The cathode pillar 45R is formed in a cylindrical shape having a central axis in the Z direction and is configured as, for example, a single layer or a multilayer structure of a plurality of layers made with metal such as Cu, Ni or Ti or alloy of such metals. This cathode pillar 45R has its lower surface be in contact with and electrically connected to the cathode wiring pad 43R. Further, the cathode pillar 45R has its upper surface forming a plane that is the same as the upper surface of the interlayer insulation layer 26R, and the cathode pillar 45R has the upper surface be in contact with and electrically connected to the cathode electrode part 61 of the common wiring layer 19.

The third thin-film layer 20R configured as above makes the light emitting element 21R function as a light emitting element of the red color by supplying electric power to the light emitting element 21R via the vertical direction wirings 23C and 23R. In this case, the light emitting element 21R emits light whose wavelength is 601-780 [nm], for example, namely, light of the red color, by making a range corresponding to the light emitting layer 32R as viewed from the Z direction (i.e., as viewed from above in FIGS. 6A and 6B), namely, a light emission region 24R (FIG. 3), emit light. The light emission region 24R is hereinafter referred to also as a third light emission region. However, due to properties of constituent materials or the like, the light emitting element 21R has lower luminous efficiency (details will be described later) compared to the light emitting element 21B of the blue color and the light emitting element 21G of the green color.

As above, in the pixel unit 8, the light emission region 24R is formed so as to at least partially overlap with the light emission region 24B (FIG. 5) and the light emission region 24G (FIG. 4) as viewed from the +Z direction (the light emission direction E) (i.e., as viewed from above in FIGS. 6A and 6B). Further, parts of the light emission region 24R are situated on the +Z direction side of the vertical direction wirings 23B and 23G (FIG. 6B).

1-4. Effect and Other Features

It has been generally known about light emitting elements that the quantum efficiency varies depending on the material property and other factors. Therefore, when high-quality white light is outputted by using the three primary colors of light at an appropriate color mixture ratio, the light emitting elements of the respective colors are necessitated to differ from each other in necessary electric power (current, voltage, or both of current and voltage).

Here, in regard to a light emitting element of a single color in a non-laminated state, the ratio of the amount of light emitted from the front surface of the pixel relative to the supplied electric power is defined as the luminous efficiency. For example, in cases of color mixture into desired white light (e.g., white light of the CIE standard light source D65) by using light emitting elements of the three primary colors of light (red color, green color and blue color), each light emitting element can be described to have high (excellent)

luminous efficiency when the necessary electric power is low compared to the light emitting elements of the other colors, and can be described to have low (poor) luminous efficiency when the necessary electric power is high.

Further, in a multilayer light emitting display device formed by stacking light emitting elements of a plurality of colors, the ratio of the amount of light emitted from the front surface (light emission surface) of the pixel relative to the supplied electric power is defined as light extraction efficiency. For example, in cases of color mixture into desired white light by using this multilayer light emitting display device, each light emitting element can be described to have high (excellent) light extraction efficiency when the necessary electric power is low compared to the light emitting elements of the other colors, and can be described to have low (poor) light extraction efficiency when the necessary electric power is high.

That is, in cases of color mixture into desired white light by using light emitted from light emitting elements of the three primary colors, the light emitting elements differ from each other in the luminous efficiency in many cases. In cases where the multilayer light emitting display device is formed, the light extraction efficiency greatly varies depending on the constituent materials, structure, thickness, etc. of each light emitting element, the order of stacking layers, and so forth.

Conventionally, there has been known a technique of adjusting the amount of electric power supplied to each light emitting element (a current value, a voltage value, or both of the current value and the voltage value) and a light emission time in order to reduce the luminous efficiency difference between the light emitting elements of the respective colors. However, this method requires complicated control such as the need of widening a range for adjusting the amount of electric power in regard to a light emitting element having low luminous efficiency, and thus can lead to cost rise. Further, when a great amount of electric power is supplied to the light emitting element having low luminous efficiency, there are also cases where the light emitting element heats up significantly and that causes performance degradation such as a drop in the luminous efficiency or a wavelength peak shift.

On the other hand, in the multilayer light emitting display device, when the pixel pitch is set extremely narrow, e.g., 20 [μm] or less, to meet a request for higher definition or other requests, the ratio of the length of one side of each pixel relative to the distance from the light emitting elements constituting the pixel to the front surface of the pixel becomes extremely small. Accordingly, in a bottom-layer light emitting element farthest from the front surface of the pixel, an angular range in which the light emitted from the light emitting element as diverging light arrives at the front surface of the pixel, namely, a valid angular range, becomes small due to a geometrical relationship, and that leads to a significant drop in the light extraction efficiency.

Figure 7A:
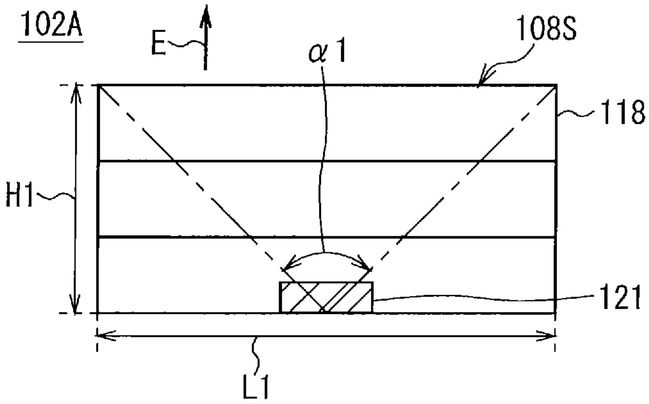
FIGS. 7A and 7B are schematic cross-sectional views showing configurations of hypothetical LED display units.

For example, in a hypothetical LED display unit 102A shown in FIG. 7A, the length of one side of a light emission surface 108S is assumed to be L1 and the distance from a light emitting element 121 situated in the lowermost layer to the light emission surface 108S is assumed to be a height H1. Further, in this LED display unit 102A, an extraction angle $\alpha 1$ representing the angular range in which the light emitted from the light emitting element 121 arrives at the light emission surface 108S is assumed to be approximately 90[°]. The magnitude of the extraction angle $\alpha 1$ is related to the magnitude of the ratio of the amount of light emitted (extracted) from the light emission surface 108S relative to the amount of light emitted in various directions from the light emitting element 121 in the lowermost layer.

Figure 7B:
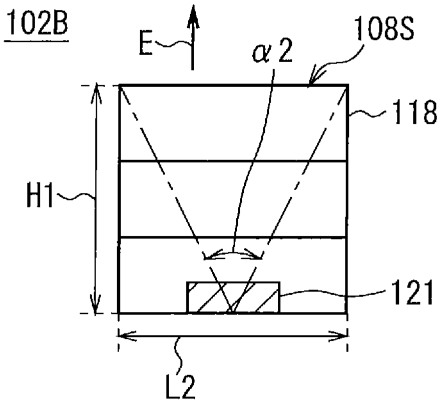

Next, as shown in FIG. 7B corresponding to FIG. 7A, in another hypothetical LED display unit 102B, it is assumed that the height is the height H1 equivalent to that of the LED display unit 102A, whereas the length of one side of the light emission surface 108S is L2 as approximately ½ of the length L1. In this LED display unit 102B, an extraction angle $\alpha 2$ representing the range in which the light emitted in various directions from the light emitting element 121 arrives at the light emission surface 108S is approximately 53[°], which is far smaller (narrower) than the extraction angle $\alpha 1$.

As above, when the pixel pitch is set small in the multilayer light emitting display device, the light extraction efficiency especially regarding the bottom-layer light emitting element drops significantly, and thus the color mixture into desired white light requires designing of the structure in consideration of the quantum efficiency, the luminous efficiency and the light extraction efficiency of the light emitting element of each color.

In light of the above-described problems, in the LED display unit 2 of the LED display device 1 according to the first embodiment, the light emitting element 21B of the blue color, the light emitting element 21G of the green color and the light emitting element 21R of the red color are arranged in each pixel unit 8 to be successively stacked from the −Z direction side towards the +Z direction side.

Further, it has been known about LEDs that the luminous efficiency drops significantly when the area of the light emission region is made extremely small, e.g., as a property when the length of one side of the square-shaped light emission region is set at less than or equal to 10 [μm]. In light of this problem, the LED display unit 2 is configured so that the light emission region 24R (FIG. 3) of the light emitting element 21R of the red color is larger than the light emission region 24B (FIG. 5) of the light emitting element 21B of the blue color and the light emission region 24G (FIG. 4) of the light emitting element 21G of the green color in each pixel unit 8.

Therefore, the LED display unit 2 is capable of drastically increasing the luminous efficiency compared to cases where the area of the light emission region 24R is set equivalent to the area of each of the light emission regions 24B and 24G. That is, the LED display unit 2 is capable of increasing the light amount of the light of the red color emitted from the light emission surface 8S to a level comparable with the blue color and the green color, without the need of enlarging the size of the pixel unit 8 and without causing an excessive increase in the amount of heat emission due to an increase in the supplied electric power.

Accordingly, when implementing an intended color (e.g., white color of the CIE standard light source D65), the LED display device 1 is capable of obtaining sufficient luminance in each pixel unit 8 without the need of lowering the luminances (light emission amounts) of the green color and the blue color to match the luminance of the red color. Consequently, the LED display device 1 is capable of displaying a high-definition and high-quality image on the whole of the display region 2A of the LED display unit 2.

Incidentally, suppose that the light emitting element 21R of the red color is formed with a semiconductor such as GaAs or AlInGaP, the transmittance in the visible light region becomes relatively low, and thus the light emitting element 21R greatly blocks light from the light emitting element 21B of the blue color and the light emitting element 21G of the green color situated on the lower side relative to the light emitting element 21R.

In this regard, as described earlier, in the light emitting element 21R according to this embodiment, the light emitting layer 32R as a relatively thin part in regard to the Z direction is formed as a semiconductor made with a gallium nitride-based material such as InGaN, and the cathode layer 31R and the anode layer 33R as relatively thick parts in regard to the Z direction are formed with GaN or the like having a relatively low light absorption rate. That is, the light emitting element 21R is configured so as to make the thickness of the layer having the property of absorbing light of the other colors as small (thin) as possible.

With this configuration, even though the light emitting element 21R according to this embodiment is situated on the +Z direction side, namely, on the light emission direction E side, relative to the light emitting element 21B of the blue color and the light emitting element 21G of the green color, the light emitting element 21R is capable of realizing sufficiently high transmittance for the light of the blue color and the green color emitted from the light emitting elements 21B and 21G.

Further, in each pixel unit 8 in the LED display unit 2, the circuit board 10 is electrically connected respectively to the first thin-film layer 20B and the second thin-film layer 20G by the vertical direction wirings 23B and 23G, whereas it is unnecessary to arrange a wiring member or the like on the +Z direction side (upper side) of the vertical direction wirings 23B and 23G. Therefore, in each pixel unit 8, the light emission region 24R of the red color is enlarged in the parts on the +Z direction side (upper side) of the vertical direction wirings 23B and 23G in comparison with the light emission region 24G of the green color and the light emission region 24B of the blue color, and thus these parts can be utilized efficiently.

With the above-described configuration, in the LED display device 1 according to the first embodiment, the light emitting element 21B of the blue color, the light emitting element 21G of the green color and the light emitting element 21R of the red color are successively stacked in the LED display unit 2, and the light emission region 24R of the red color is formed to be larger than the light emission region 24B of the blue color and the light emission region 24G of the green color in each pixel unit 8. Therefore, the LED display device 1 is capable of increasing the light amount of the light of the red color emitted from the light emission surface 8S to a level comparable with the blue color and the green color even while making the size of each pixel unit 8 extremely small. Accordingly, the LED display device 1 is capable of obtaining sufficient luminance regarding all of the blue color, the green color and the red color in each pixel unit 8, and is capable of displaying a high-definition and high-quality image on the whole of the display region 2A.

2. Second Embodiment

Figure 8A:
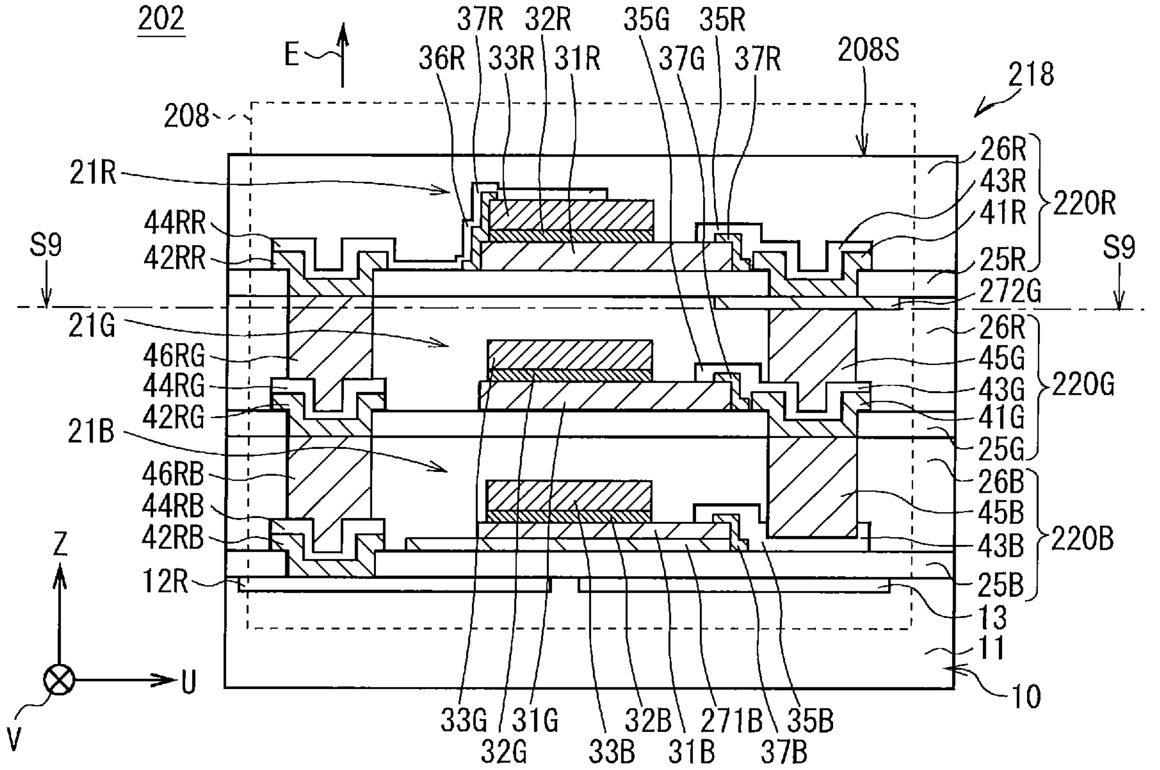
FIGS. 8A and 8B are schematic cross-sectional views showing the configuration of an LED display unit according to a second embodiment.
Figure 8B:
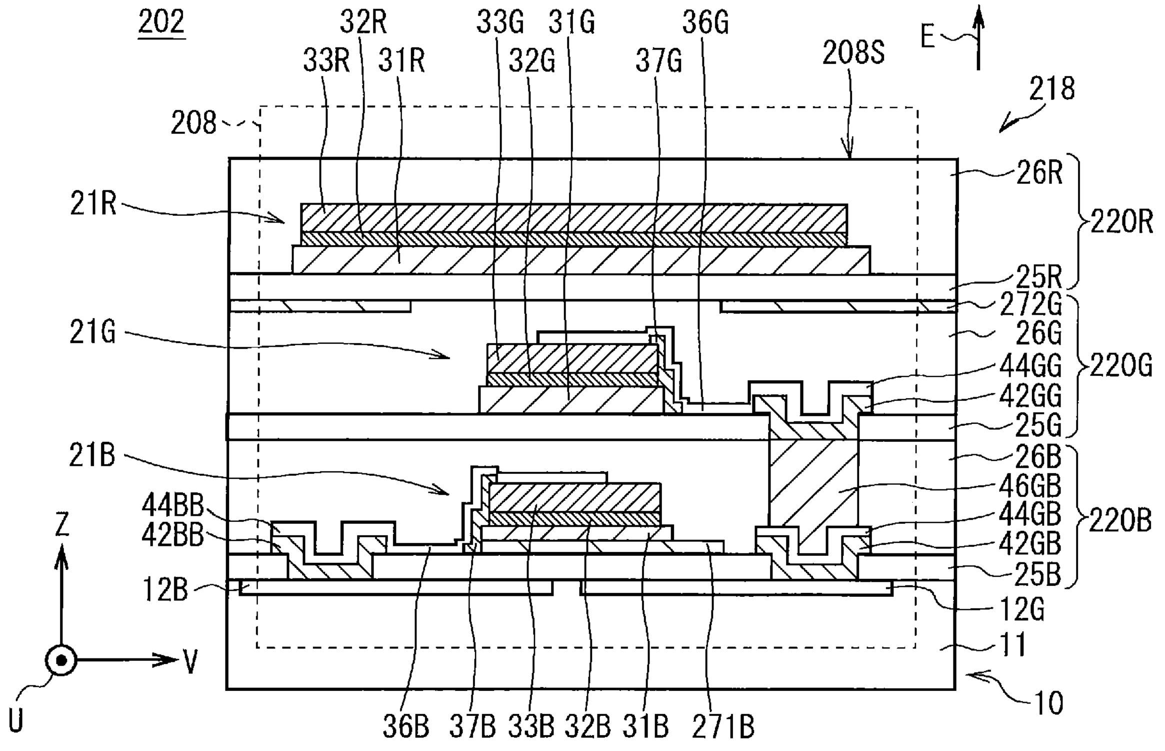

An LED display device 201 (FIG. 1) according to a second embodiment differs from the LED display device 1 according to the first embodiment in including an LED display unit 202 replacing the LED display unit 2, while being configured in the same way as the LED display device 1 in regard to the other features. As shown in FIGS. 8A and 8B corresponding to FIGS. 6A and 6B, the LED display unit 202 as compared with the LED display unit 2 includes a thin-film layer set 218 replacing the thin-film layer set 18, while the common wiring layer 19 is left out. Further, in the LED display unit 202, a plurality of pixel units 208, corresponding to the pixel units 8 of the LED display unit 2, are arranged in the X direction and the Y direction like a lattice.

The thin-film layer set 218 includes a first thin-film layer 220B, a second thin-film layer 220G and a third thin-film layer 220R instead of the first thin-film layer 20B, the second thin-film layer 20G and the third thin-film layer 20R in the thin-film layer set 18 according to the first embodiment.

The first thin-film layer 220B differs from the first thin-film layer 20B according to the first embodiment in that a lower reflective layer 271B is added, while being configured in the same way as the first thin-film layer 20B in regard to the other features. The lower reflective layer 271B as a second reflective layer is provided between the base insulation layer 25B and the cathode layer 31B in regard to the Z direction, and is formed in a part not overlapping with the cathode lead wiring 35B, the anode electrode pad 42BB or the like on an XY plane.

This lower reflective layer 271B is formed with a metallic material such as Au, Ag, Al, Ti or Ni or alloy of such metals, a predetermined organic material, an inorganic material, or the like, for example, and its reflectance regarding visible light is extremely high. It is also possible to form the lower reflective layer 271B with the same material as the anode electrode pad 42BB, for example.

The second thin-film layer 220G differs from the second thin-film layer 20G according to the first embodiment in that an intermediate reflective layer 272G is added, while being configured in the same way as the second thin-film layer 20G in regard to the other features. The intermediate reflective layer 272G as a first reflective layer is provided on the +Z direction side relative to the anode layer 33G and on the most +Z direction side in the second thin-film layer 220G in regard to the Z direction. Here, FIG. 9 is a cross-sectional view taken along the S9-S9 cross section in FIG. 8A.

Figure 9:
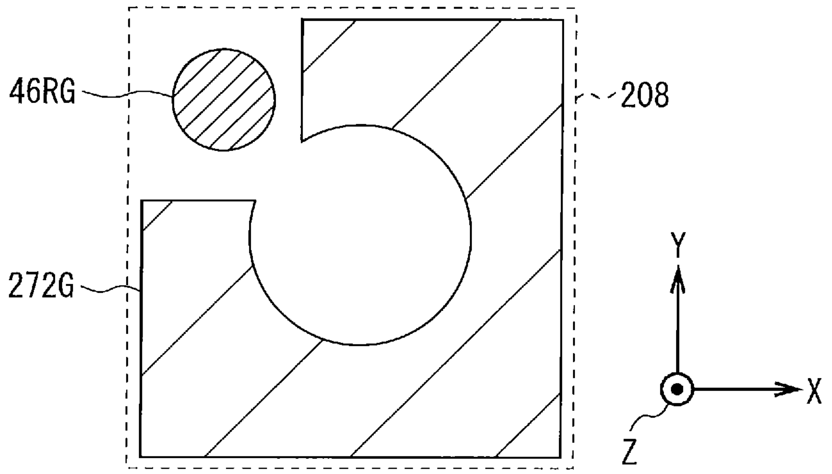
FIG. 9 is a schematic diagram showing the configuration of an intermediate reflective layer according to the second embodiment, which is a cross-sectional view taken along the S9-S9 arrow view cross section in FIGS. 8A and 8B.

As shown in FIG. 9, the intermediate reflective layer 272G is formed throughout a wide range obtained by excluding a circular range one size larger than the range in which the anode layer 33G and the light emitting layer 32G are formed (FIG. 4 and FIG. 5) and excluding a vicinity of the vertical direction wiring 23R. This intermediate reflective layer 272G is formed with a metallic material such as Au, Ag, Al, Ti or Ni or alloy of such metals, a predetermined organic material, an inorganic material, or the like, for example, and its reflectance regarding at least the light of the red color is extremely high. Incidentally, in the intermediate reflective layer 272G, the size of the circular part at the center can be set appropriately so that desired light extraction efficiency can be obtained, based on the light emission amounts of the light of the blue color and the green color from the light emitting elements 21B and 21G, the transmittance of the intermediate reflective layer 272G for the light of the blue color and the green color, and so forth.

Further, the intermediate reflective layer 272G is electrically connected to the cathode pillar 45G in each pixel unit 208, and is also electrically interconnected with each other between pixel units 208 adjoining each other in the X direction or the Y direction. Furthermore, the intermediate reflective layer 272G is connected to a common cathode connection terminal of a driver 6 at a position outside the range of the display region 2A. With this configuration, the intermediate reflective layer 272G implements the function as the common wiring connected in common with the cathodes of the light emitting elements 21 of the respective colors similarly to the common wiring layer 19 (FIG. 3 and FIGS. 6A and 6B) in the first embodiment.

The third thin-film layer 220R differs from the third thin-film layer 20R according to the first embodiment in that the cathode pillar 45R (FIG. 6A) is left out, while being configured in the same way as the third thin-film layer 20R in regard to the other features.

In the above-described configuration, in the LED display device 201 according to the second embodiment, the light emitting element 21B of the blue color, the light emitting element 21G of the green color and the light emitting element 21R of the red color are arranged in each pixel unit 208 of the LED display unit 202 to be successively stacked from the −Z direction side towards the +Z direction side similarly to the first embodiment. Further, the LED display unit 202 is configured so that the light emission region 24R (FIG. 3) of the red color is larger than the light emission region 24B (FIG. 5) of the blue color and the light emission region 24G (FIG. 4) of the green color in each pixel unit 208 similarly to the first embodiment.

Therefore, similarly to the first embodiment, the LED display device 201 is capable of drastically increasing the luminous efficiency and thus is capable of increasing the light amount of the light of the red color emitted from the light emission surface 208S to a level comparable with the blue color and the green color without the need of enlarging the size of the pixel unit 208 and without causing an excessive increase in the amount of heat emission due to an increase in the supplied electric power.

In addition, in the LED display unit 202, the light of the blue color and the green color respectively emitted from the light emitting elements 21B and 21G is mainly reflected by the lower reflective layer 271B and the light of the red color emitted from the light emitting elements 21R is reflected by the intermediate reflective layer 272G. Accordingly, the LED display device 201 is capable of increasing the light amount of light emitted from the light emission surface 208S and traveling in the light emission direction E when the same electric power is supplied, namely, increasing the light extraction efficiency, in comparison with the first embodiment.

Further, in the LED display unit 202, as compared with the LED display unit 2 according to the first embodiment, the cathode pillar 45R of the third thin-film layer 20R is left out and the common wiring layer 19 is left out. Accordingly, the LED display device 201 is capable of reducing factors inhibiting the light emitted from the light emitting element 21 of each color from arriving at the light emission surface 208S and thereby further increasing the light extraction efficiency.

Consequently, the LED display unit 202 according to the second embodiment is capable of achieving still higher luminance in comparison with the LED display unit 2 according to the first embodiment. As a result, the LED display unit 202 is capable of displaying a high-definition and high-quality image.

Furthermore, also in regard to the other features, the LED display device 201 according to the second embodiment is capable of achieving the same functions and effects as the LED display device 1 according to the first embodiment.

3. Third Embodiment

Figure 10:
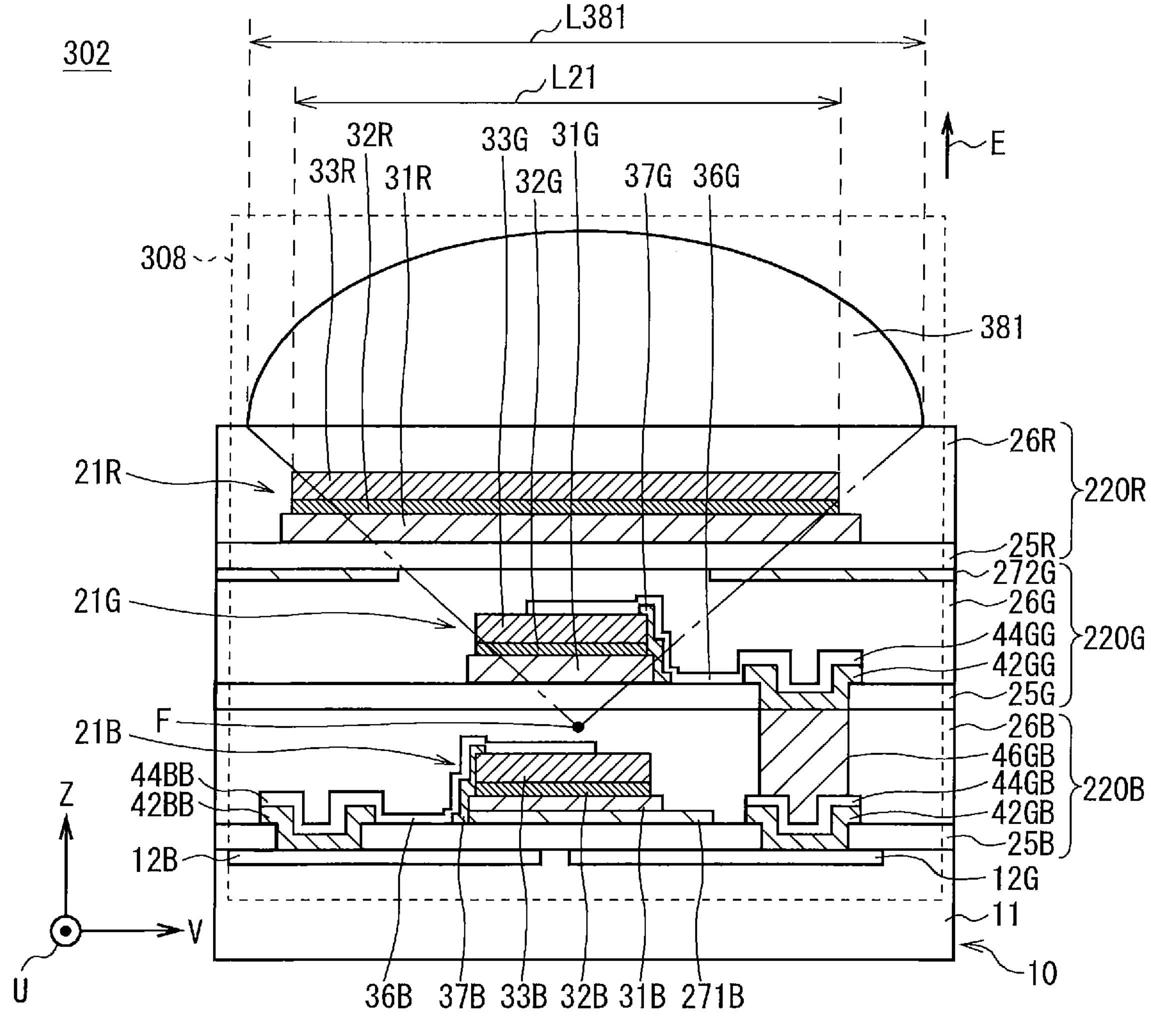
FIG. 10 is a schematic cross-sectional view showing the configuration of an LED display unit according to a third embodiment.

An LED display device 301 (FIG. 1) according to a third embodiment differs from the LED display device 1 according to the first embodiment in including an LED display unit 302 replacing the LED display unit 2, while being configured in the same way as the LED display device 1 in regard to the other features. As shown in FIG. 10 corresponding to FIG. 8B, the LED display unit 302 differs from the LED display unit 202 in including a lens 381, while being configured in the same way as the LED display unit 202 in regard to the other features. Further, in the LED display unit 302, a plurality of pixel units 308, corresponding to the pixel units 8 of the LED display unit 2, are arranged in the X direction and the Y direction like a lattice.

The lens 381 is formed with a material having relatively high transmittance for visible light, and is provided to be overlaid on the +Z direction side of the third thin-film layer 220R. On this lens 381, the lower surface is formed in a shape of a flat plane, while the upper surface is formed as a spherical or aspherical curved surface. With this configuration, the lens 381 is capable of implementing the function of refracting and condensing or diverging light similarly to generic lenses. Further, the lens 381 has been designed so that its focal point F is situated slightly below the light emitting element 21R of the red color.

Here, optical properties of the lens 381 will be described below. In the pixel unit 308, in regard to the V direction (transverse direction on the sheet of FIG. 10), the difference between a length L381 as the length of the lens 381 and a length L21R as the length of each of the light emitting layer 32R, the anode layer 33R, etc. in the light emitting element 21R is relatively small.

In cases where such a lens 381 is provided, a case where the focal point F of the lens 381 is tentatively arranged in the light emitting layer 32R is assumed here. In this case, light emitted from a central part of the light emitting element 21R is appropriately refracted and condensed by the lens 381. On the other hand, light emitted from a part of the light emitting element 21R other than the central part is refracted by the lens 381 in a diverging direction.

When the focal point F of the lens 381 is arranged in the light emitting layer 32R as above, the luminance when the pixel unit 308 is viewed from the Z direction (i.e., viewed from above in FIG. 10) decreases compared to the first or second embodiment not including the lens 381. Further, in this configuration, there is a danger that the lens 381 causes the light to travel in unintended directions to diverge and that deteriorates the image quality of the image displayed by the LED display unit 302.

Therefore, in the LED display unit 302 according to the third embodiment, the optical properties of the lens 381 are set so as to place the focal point F of the lens 381 on the −Z direction side, namely, on a side in a direction opposite to the light emission direction E, relative to the light emitting layer 32R of the light emitting element 21R. Accordingly, in the LED display device 301, light emitted from a wide range in the light emission region 24 (FIG. 3) of the light emitting element 21R can be condensed by the lens 381 without diverging the light, by which the luminance when the pixel unit 308 is viewed from the Z direction (i.e., viewed from above in FIG. 10) can be increased.

Further, also in regard to the other features, the LED display device 301 according to the third embodiment can achieve the same functions and effects as the LED display device 201 according to the second embodiment.

4. Fourth Embodiment

An LED display device 401 (FIG. 1) according to a fourth embodiment differs from the LED display device 1 according to the first embodiment in including an LED display unit 402 replacing the LED display unit 2, while being configured in the same way as the LED display device 1 in regard to the other features.

Figure 11:
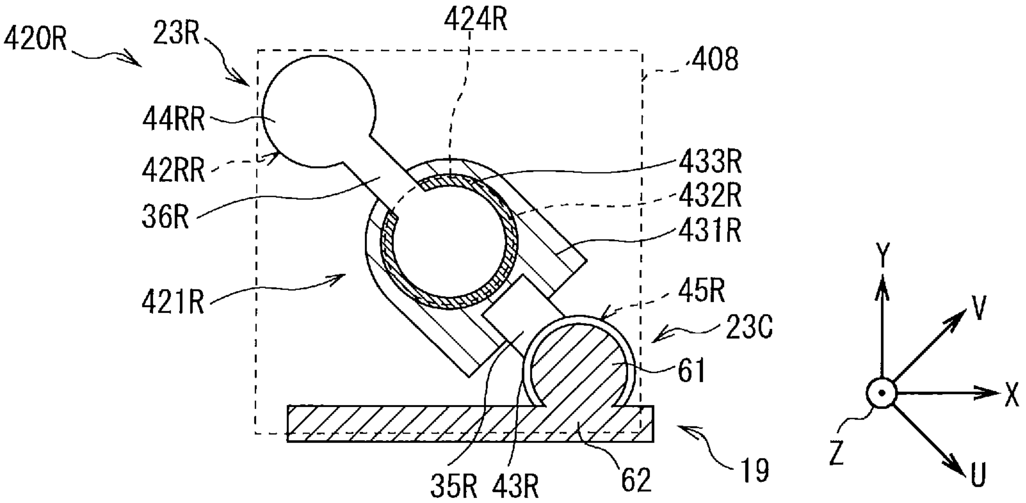
FIG. 11 is a schematic plan view showing the configuration of a third thin-film layer and a common wiring layer according to a fourth embodiment.
Figure 12:
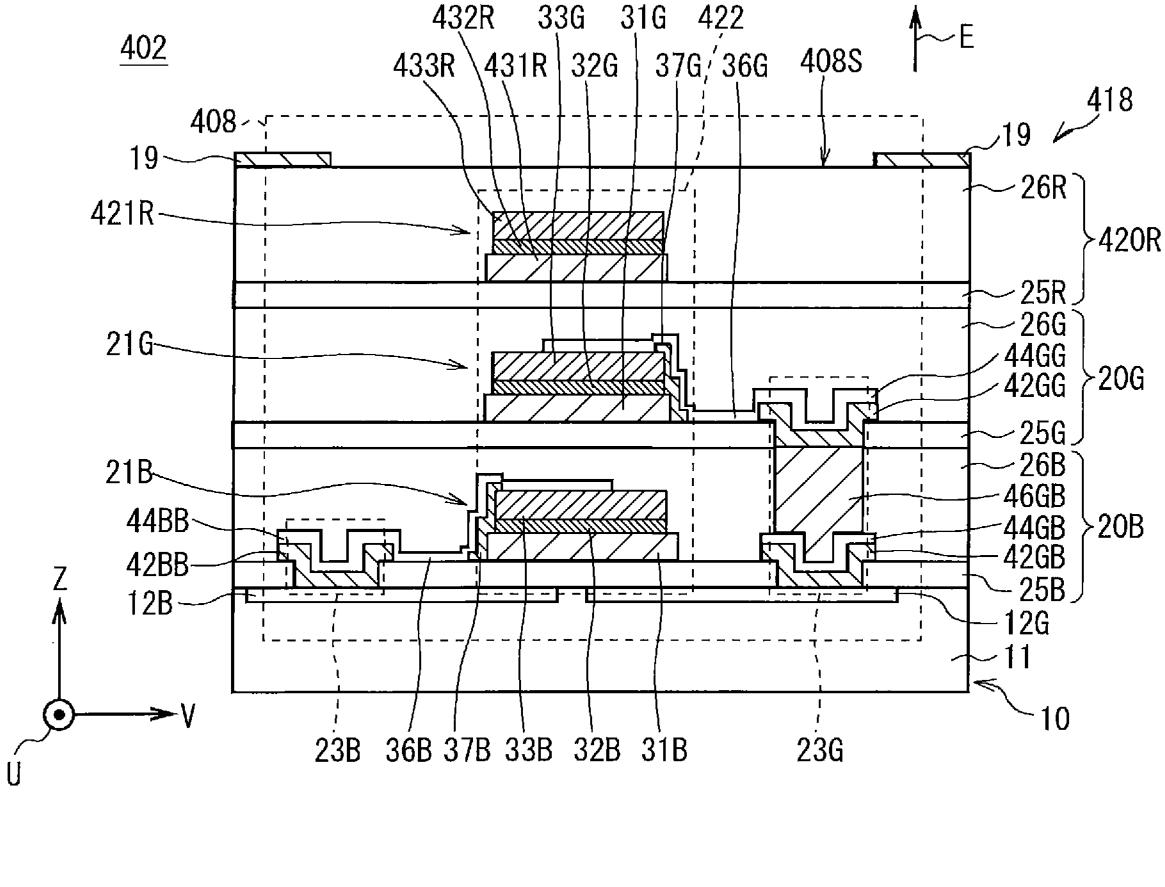
FIG. 12 is a schematic cross-sectional view showing the configuration of an LED display unit according to the fourth embodiment.

As shown in FIG. 11 and FIG. 12 corresponding to FIG. 3 and FIG. 6B, the LED display unit 402 as compared with the LED display unit 2 includes a thin-film layer set 418 replacing the thin-film layer set 18. Further, in the LED display unit 402, a plurality of pixel units 408, corresponding to the pixel units 8 of the LED display unit 2, are arranged in the X direction and the Y direction like a lattice.

The thin-film layer set 418 differs from the thin-film layer set 18 according to the first embodiment in including a third thin-film layer 420R replacing the third thin-film layer 20R, while being configured in the same way as the thin-film layer set 18 in regard to the first thin-film layer 20B and the second thin-film layer 20G. The third thin-film layer 420R differs from the third thin-film layer 20R according to the first embodiment in including a light emitting element 421R replacing the light emitting element 21R, while being configured in the same way as the third thin-film layer 20R in regard to the other features.

The light emitting element 421R includes a cathode layer 431R, a light emitting layer 432R and an anode layer 433R replacing the cathode layer 31R, the light emitting layer 32R and the anode layer 33R of the light emitting element 21R. The cathode layer 431R, the light emitting layer 432R and the anode layer 433R are respectively formed in sizes and shapes equivalent to those of the cathode layer 31B, the light emitting layer 32B and the anode layer 33B in the light emitting element 21B of the blue color (FIG. 5) in the first embodiment. Therefore, in the light emitting element 421R, the shape and the size of a light emission region 424R (FIG. 11) are the same as those of each of the light emission region 24B of the blue color (FIG. 5) and the light emission region 24G of the green color (FIG. 4) in the first embodiment.

In the above-described configuration, in the LED display device 401 according to the fourth embodiment, the light emitting element 21B of the blue color, the light emitting element 21G of the green color and the light emitting element 421R of the red color are arranged in each pixel unit 408 of the LED display unit 402 to be successively stacked from the −Z direction side towards the +Z direction side similarly to the first embodiment. On the other hand, in the LED display unit 402, the light emission region 424R of the red color (FIG. 11) is formed like the light emission region 24B of the blue color (FIG. 5) and the light emission region 24G of the green color (FIG. 4) in each pixel unit 408 differently from the first embodiment.

With this configuration, the LED display unit 402 is capable of increasing the luminous efficiency of each pixel unit 408 and sufficiently increasing the light amount of the light of the red color emitted from a light emission surface 408S even though the degree of the increase is lower in comparison with the first embodiment.

Further, the LED display device 401 according to the fourth embodiment can achieve the same functions and effects as the LED display device 1 according to the first embodiment in regard to the arrangement of the third thin-film layer 420R of the red color on the +Z direction side (upper side) relative to the first thin-film layer 20B of the blue color and the second thin-film layer 20G of the green color.

5. Fifth Embodiment

An LED display device 501 (FIG. 1) according to a fifth embodiment differs from the LED display device 1 according to the first embodiment in including an LED display unit 502 replacing the LED display unit 2, while being configured in the same way as the LED display device 1 in regard to the other features.

Figure 13:
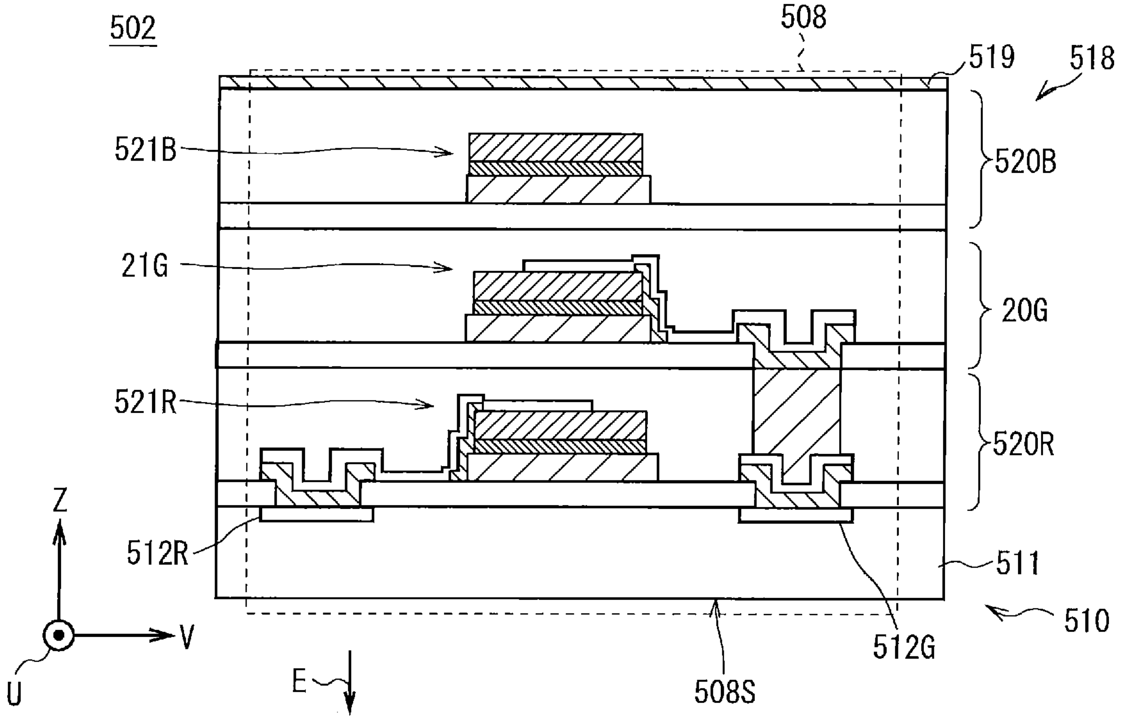
FIG. 13 is a schematic cross-sectional view showing the configuration of an LED display unit according to a fifth embodiment.

As shown in FIG. 13 corresponding to FIG. 6B, the LED display unit 502 differs from the LED display unit 2 in including a transparent circuit board 510, a thin-film layer set 518 and a reflective layer 519 replacing the circuit board 10, the thin-film layer set 18 and the common wiring layer 19, while being configured in the same way as the LED display device 1 in regard to the thin-film layer set 18. Further, in the LED display unit 502, a plurality of pixel units 508, corresponding to the pixel units 8 of the LED display unit 2, are arranged in the X direction and the Y direction like a lattice.

The transparent circuit board 510 is formed mainly with a transparent base material part 511 having relatively high transmittance for visible light and the insulating property, and is provided with a wiring layer (not illustrated), predetermined drive elements and drive circuits, and so forth. Further, the transparent circuit board 510 includes anode substrate pads 512R, 512G, etc. corresponding respectively to the anode substrate pads 12B, 12G, etc. These anode substrate pads 512R and 512G are reduced in the area on an XY plane compared to the anode substrate pads 12B, 12G, etc.

In the thin-film layer set 518, a first thin-film layer 520B, the second thin-film layer 20G and a third thin-film layer 520R are successively stacked from the +Z direction side towards the −Z direction side. That is, in the thin-film layer set 518, the order of stacking layers in regard to the colors is opposite in comparison with the thin-film layer set 418 (FIG. 12) according to the fourth embodiment.

The first thin-film layer 520B, while being configured similarly to the third thin-film layer 420R (FIG. 12) in the fourth embodiment, includes a light emitting element 521B instead of the light emitting element 421R. The second thin-film layer 20G is configured in the same way as the second thin-film layer 20G (FIG. 12) in the fourth embodiment. The third thin-film layer 520R, while being configured similarly to the first thin-film layer 20B (FIG. 12) in the fourth embodiment, includes a light emitting element 521R instead of the light emitting element 21B.

The reflective layer 519 is made with a material having the electrical conductivity similarly to the common wiring layer 19 (e.g., FIG. 3) in the first embodiment and is formed in a shape like a thin film being thin in the Z direction on an entire surface of the first thin-film layer 520B on the +Z direction side. This reflective layer 519 has a lower surface (surface on the −Z direction side) formed extremely flat, and has a property of reflecting visible light with high reflectance.

In the above-described configuration, in the LED display device 501 according to the fifth embodiment, the light emitting element 521B of the blue color, a light emitting element 521G of the green color and the light emitting element 521R of the red color are arranged in each pixel unit 508 of the LED display unit 502 to be successively stacked from the +Z direction side towards the −Z direction side. Further, in the LED display unit 502, the transmittance of visible light at the transparent circuit board 510 is increased and the reflectance of visible light at the reflective layer 519 is increased.

Therefore, in the LED display unit 502, part of the light respectively emitted from the light emitting elements 521B, 21G and 521R that has traveled in the +Z direction is reflected by the reflective layer 519 to travel in the −Z direction and is emitted from the lower surface (surface on the −Z direction side) of the transparent circuit board 510. That is, the LED display unit 502 is capable of emitting light in the light emission direction E as the −Z direction by using the lower surface of the transparent circuit board 510 as a light emission surface 508S. In addition, in the LED display unit 502, part of the light respectively emitted from the light emitting elements 521B, 21G and 521R that is heading in the −Z direction is allowed to travel in the −Z direction without change and pass through the transparent circuit board 510.

That is, for the light respectively emitted from the light emitting elements 521B, 21G and 521R of the respective colors, the LED display unit 502 is capable of superimposing the part having headed in the +Z direction and reflected by the reflective layer 519 and the part heading in the −Z direction together and emitting the superimposed light in an emission direction E from the light emission surface 508S as the lower surface of the transparent circuit board 510. By this, the LED display unit 502 is capable of increasing the light extraction efficiency in comparison with the first embodiment.

Further, also in regard to the other features, the LED display device 501 according to the fifth embodiment is capable of achieving the same functions and effects as the LED display device 401 according to the fourth embodiment.

6. Other Embodiments

Figure 14A:
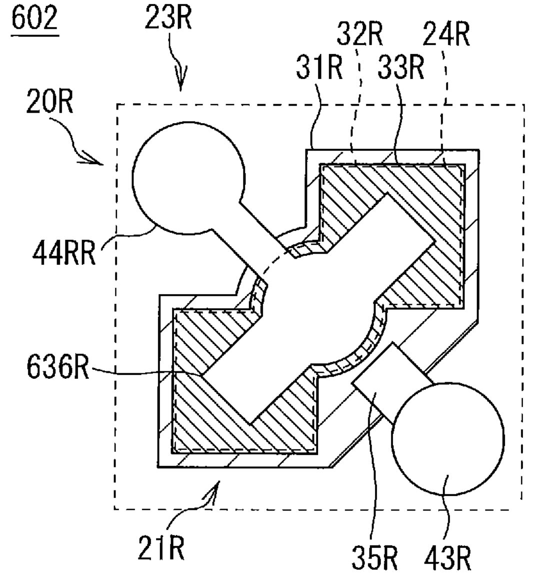
FIGS. 14A to 14D are schematic plan views showing the configurations of third thin-film layers according to other embodiments.

Incidentally, in the above-described first embodiment, a description is given of a mode in regard to the third thin-film layer 20R (FIG. 3) in which the anode lead wiring 36R is formed to cover only the circular part in the vicinity of the center of the light emitting element 21R as viewed from the Z direction side (i.e., as viewed from above in FIGS. 6A and 6B). However, the present invention is not limited to this mode, and as in an LED display unit 602 shown in FIG. 14A corresponding to FIG. 3, for example, it is also possible to provide an anode lead wiring 636R extended so as to also cover parts of the square-shaped parts. With this configuration, the area of contact between the anode lead wiring 636R and the anode layer 33R can be enlarged compared to the first embodiment (FIG. 3), and thus electric current can be distributed to a wide range in the anode layer 33R and electric current to be supplied to the light emitting layer 32 can be fed evenly through the anode layer 33R. Consequently, it becomes possible in the light emitting element 21R to further increase the luminous efficiency. The same goes for the second to fifth embodiments.

In the above-described first embodiment, a description is given of a mode in regard to the light emitting element 21R (FIG. 3) in which the light emitting element 21R is formed at a position and in a shape to totally cover the light emitting element 21G (FIG. 4) as viewed from the Z direction side (i.e., as viewed from above in FIGS. 6A and 6B). However, the present invention is not limited to this mode and it is also possible to set the position and the shape of the light emitting element 21R so as not to cover at least part of the light emitting element 21B and the light emitting element 21G as viewed from the Z direction side (i.e., as viewed from above in FIGS. 6A and 6B). Specifically, as in an LED display unit 702 shown in FIG. 14B corresponding to FIG. 3, for example, it is also possible to leave out a part of the central circular part on the −X direction side and the +Y direction side in a cathode layer 731R, a light emitting layer 732R and an anode layer 733R constituting a light emitting element 721R. A light emission region 724R of the red color is in a shape like that obtained by removing the part left out of the anode layer 733R and the like from the light emission region 24R in the first embodiment. In this case, the light emitting element 721R can be made not to cover a part of the light emitting element 21G in the part left out as viewed from the Z direction side (i.e., as viewed from above in FIGS. 6A and 6B). Further, in this case, in the square-shaped parts of the anode layer 733R, the shape of an anode lead wiring 736R (indicated by broken lines in FIG. 14B) can be set so as to secure a sufficient area of contact between the anode layer 733R and the anode lead wiring 736R.

Figure 14B:
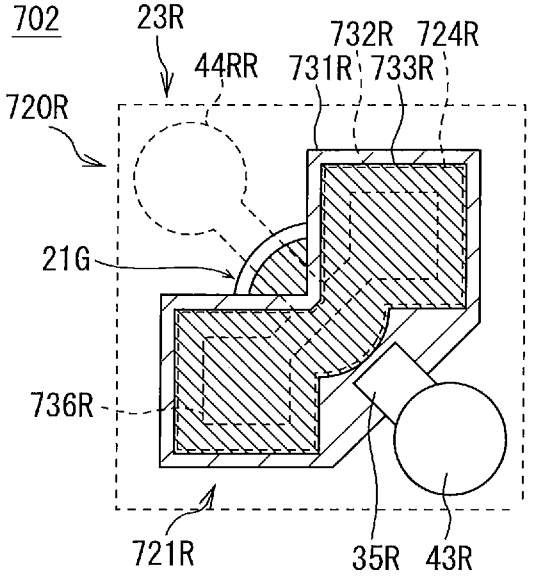
Figure 14C:
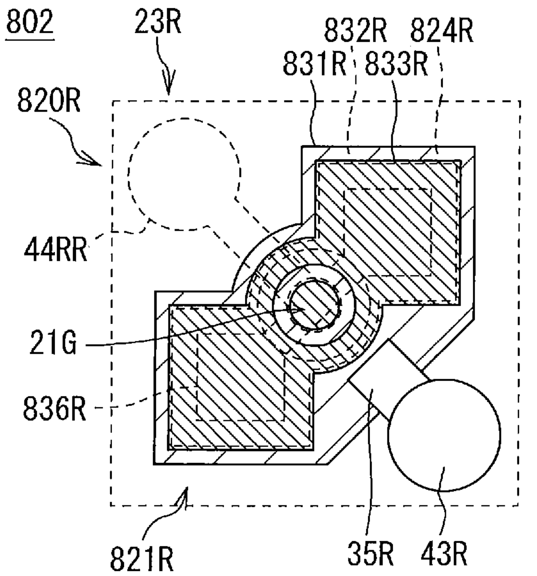

Further, as in an LED display unit 802 shown in FIG. 14C corresponding to FIG. 14B, for example, a hole part penetrating each layer in the Z direction may be formed in the vicinity of the center of the central circular part in a cathode layer 831R, a light emitting layer 832R and an anode layer 833R constituting a light emitting element 821R. The shape of the hole part as viewed from the Z direction (i.e., as viewed from above in FIGS. 6A and 6B) can be set as a variety of shape such as a circular shape, a quadrangular shape, a hexagonal shape or an octagonal shape, for example. A light emission region 824R of the red color is in a shape like that obtained by removing a part corresponding to the hole part formed in the anode layer 833R and the like from the light emission region 24R in the first embodiment. In this case, the light emitting element 821R can be made not to cover a part of the light emitting element 21G in the hole part as viewed from the Z direction side (i.e., as viewed from above in FIGS. 6A and 6B). Further, in this case, similarly to the case of the anode lead wiring 736R (FIG. 14B), in the square-shaped parts of the anode layer 833R, the shape of an anode lead wiring 836R (indicated by broken lines in FIG. 14C) can be set so as to secure a sufficient area of contact between the anode layer 833R and the anode lead wiring 836R.

Figure 14D:
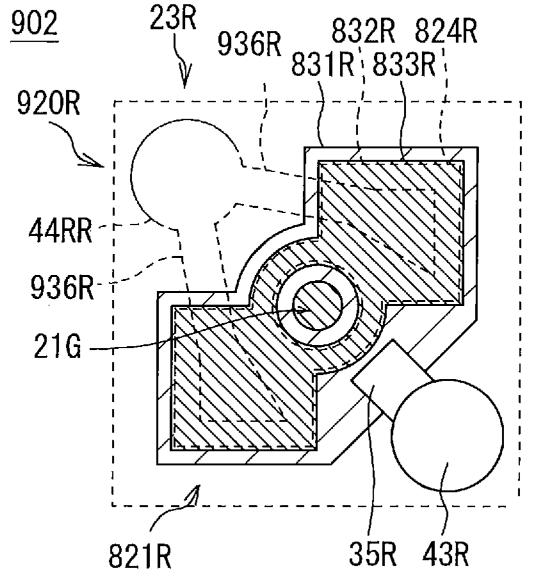

Furthermore, as in an LED display unit 902 shown in FIG. 14D corresponding to FIG. 14C, for example, it is also possible to provide the same light emitting element 821R as that in the LED display unit 802 and provide an anode lead wiring 936R in a shape different from the anode lead wiring 836R. This anode lead wiring 936R is formed so as not to overlap with the hole part of the light emitting element 821R. Therefore, in the LED display unit 902, even a material whose transmittance for light of the green color and the blue color is slightly low, for example, can be employed as a constituent material of the anode lead wiring 936R. The same goes for the second to fifth embodiments.

Figure 15:
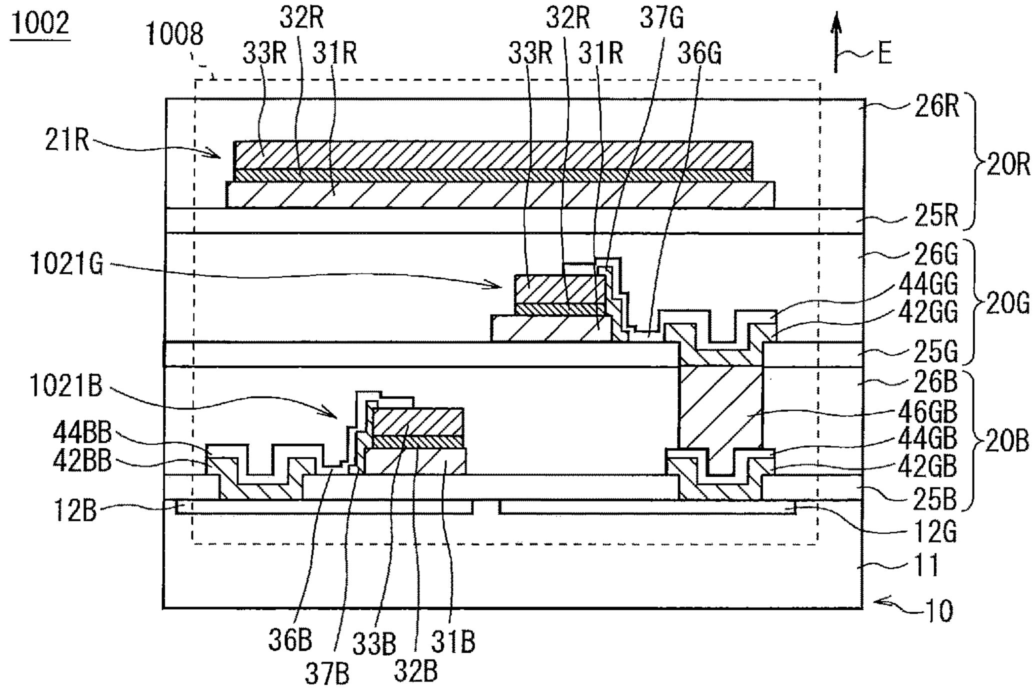
FIG. 15 is a schematic cross-sectional view showing the configuration of an LED display unit according to another embodiment.

In the above-described first embodiment, a description is given of a mode in which the centers of the light emitting elements 21B, 21G and 21R are arranged to be substantially registered with the center of the pixel unit 8 on an XY plane (FIG. 3 to FIGS. 6A and 6B). However, the present invention is not limited to this mode, and as in an LED display unit 1002 shown in FIG. 15 corresponding to FIG. 6B, for example, it is also possible to arrange each of the centers of light emitting elements 1021B and 1021G like moving it from the center of a pixel unit 1008 on an XY plane to a different position. With this configuration, it becomes unnecessary for the light of the blue color from the lowermost layer to pass through the light emitting element 21G of the green color, and thus the light extraction efficiency can be increased. The same goes for the second to fifth embodiments.

In the above-described first embodiment, a description is given of a mode in which the light emitting layer 32B and the anode layer 33B in the first thin-film layer 20B are formed to be equivalent in size to the light emitting layer 32G and the anode layer 33G in the second thin-film layer 20G so as to overlap with the light emitting layer 32G and the anode layer 33G without sticking out as viewed from the Z direction (i.e., as viewed from above in FIGS. 6A and 6B) (FIG. 4 to FIGS. 6A and 6B). However, the present invention is not limited to this mode and it is also possible to form the light emitting layer 32B and the anode layer 33B in the first thin-film layer 20B so that at least a part sticks out as viewed from the Z direction (i.e., as viewed from above in FIGS. 6A and 6B), such as forming the light emitting layer 32B and the anode layer 33B in the first thin-film layer 20B to be respectively one size larger than the light emitting layer 32G and the anode layer 33G in the second thin-film layer 20G, for example. With this configuration, the light extraction efficiency of the light extraction from the light emission surface 8S can be increased in regard to the light of the blue color emitted from the light emitting element 21B of the blue color situated in the lowermost layer. The same goes for the second to fifth embodiments.

In the above-described second embodiment, a description is given of a mode in which the cathode pillar 45R in the third thin-film layer 220R and the common wiring layer 19, which are provided in the LED display unit 2 (FIG. 6B) according to the first embodiment, are left out in the LED display unit 202 (FIGS. 8A and 8B). However, the present invention is not limited to this mode and it is also possible, for example, to provide the third thin-film layer 220R with the cathode pillar 45R and provide the common wiring layer 19 similarly to the first embodiment. In this case, it is unnecessary to electrically connect the intermediate reflective layer 272G to the cathode pillar 45G in the second thin-film layer 220G.

In the above-described second embodiment, a description is given of a mode in which both of the lower reflective layer 271B and the intermediate reflective layer 272G are provided (FIGS. 8A and 8B and FIG. 9). However, the present invention is not limited to this mode and it is also possible to provide only either one of the lower reflective layer 271B and the intermediate reflective layer 272G. Nevertheless, in cases where the intermediate reflective layer 272G is left out, it is desirable to provide the third thin-film layer 220R with the cathode pillar 45R and provide the common wiring layer 19 similarly to the above-described mode. Further, the position of the intermediate reflective layer 272G in regard to the Z direction is not limited to the most +Z direction side in the second thin-film layer 220G but can also be set at an arbitrary position on the −Z direction side relative to the light emitting element 21R. Furthermore, the position of the lower reflective layer 271B in regard to the Z direction is not limited to the position between the base insulation layer 25B and the cathode layer 31B in the first thin-film layer 220B but can also be set at an arbitrary position such as the −Z direction side of the base insulation layer 25B, for example.

Figure 16:
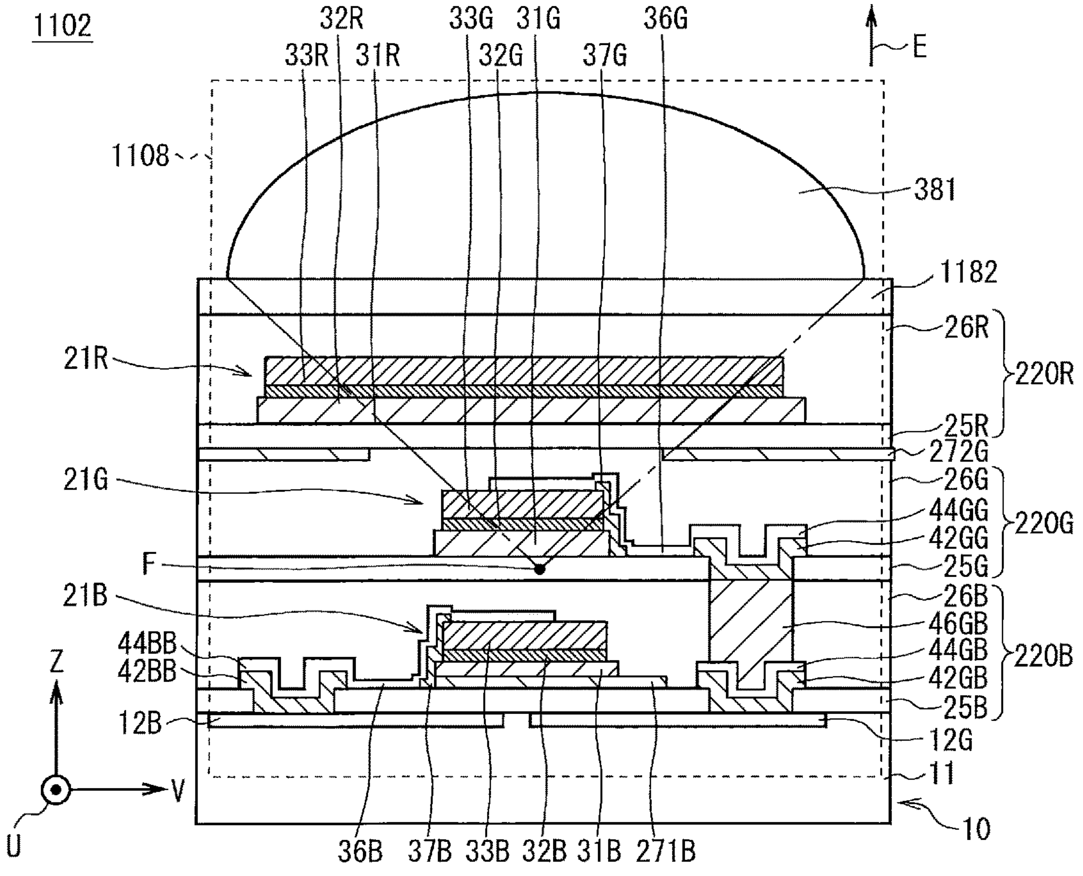
FIG. 16 is a schematic cross-sectional view showing the configuration of an LED display unit according to another embodiment.

In the above-described third embodiment, a description is given of a mode in which the lens 381 in each pixel unit 308 is provided to be overlaid on the +Z direction side of the third thin-film layer 220R (FIG. 10). However, the present invention is not limited to this mode, and as in an LED display unit 1102 shown in FIG. 16 corresponding to FIG. 10, for example, it is also possible to provide an elevation layer 1182 formed with a material allowing visible light to pass through, on the +Z direction side of the third thin-film layer 220R and provide the lens 381 to be overlaid on the +Z direction side of the elevation layer 1182. In this case, by appropriately setting the length (i.e., thickness) of the elevation layer 1182 in the Z direction, the focal point F of the lens 381 can be set at a desired position in the Z direction relative to the light emitting element 21R.

In the above-described first embodiment, a description is given of a mode in which the light of the red color is emitted by the thin-film layer 20 on the most Z direction side (the third thin-film layer 20R) and the light of the green color is emitted by the thin-film layer (the second thin-film layer 20G) on the −Z direction side (lower side) of the third thin-film layer 20R (FIGS. 6A and 6B). However, the present invention is not limited to this mode and it is also possible to make the thin-film layers 20 respectively emit light of various colors, such as making the thin-film layer 20 on the most Z direction side emit the light of the green color and making the thin-film layer 20 on the −Z direction side of the former thin-film layer 20 emit the light of the red color, for example. It is desirable to make the thin-film layer 20 on the most Z direction side emit light of a color regarding which the luminous efficiency or the light extraction efficiency is the lowest. The same goes for the second to fifth embodiments.

In the above-described first embodiment, a description is given of a case where three thin-film layers 20, such as the first thin-film layer 20B, the second thin-film layer 20G and the third thin-film layer 20R, are provided in the LED display unit 2 to be stacked in the Z direction. However, the present invention is not limited to this case and it is also possible to employ a configuration obtained by stacking two or four or more thin-film layers 20 in the Z direction, for example. In this case, the light emission region 24 of the light emitting element 21 provided in the thin-film layer 20 situated on the most Z direction side is desired to be made larger than the light emission regions 24 of the light emitting elements 21 provided in the other thin-film layers 20. The same goes for the second to fifth embodiments.

In the above-described first embodiment, a description is given of a case where every one of the cathode layer 31R, the light emitting layer 32R and the anode layer 33R constituting the light emitting element 21R of the red color is formed with a gallium nitride-based or indium gallium nitride-based material such as GaN, AlGaN or InGaN. However, the present invention is not limited to this case and it is also possible, for example, to form at least one of the cathode layer 31R, the light emitting layer 32R and the anode layer 33R with a different material. The same goes for the light emitting element 21B of the blue color and the light emitting element 21G of the green color. Further, the same goes for the second to fifth embodiments.

In the above-described first embodiment, a description is given of a mode in which the present invention is applied to the LED display device 1 of the direct-view type. However, the present invention is not limited to this mode and it is also possible to apply the present invention to a display device used as a projector or a light source, for example. The same goes for the second to fifth embodiments.

In the above-described first embodiment, a description is given of a case where the light emitting elements 21 (21B, 21G and 21R) are used as the semiconductor elements. However, the present invention is not limited to this case and it is also possible to use various other semiconductor elements such as photodiodes or transistors, for example. The same goes for the second to fifth embodiments.

Further, the present invention is not limited to the embodiments described above. That is, the scope of application of the present invention ranges also to embodiments obtained by arbitrarily combining parts or the whole of some of the above-described embodiments and the other embodiments Further, the scope of application of the present invention ranges also to embodiments obtained by extracting a part of a configuration described in an arbitrary embodiment among the above-described embodiments and the other embodiments and substituting/diverting the extracted part of the configuration for/to a part of the configuration of an arbitrary embodiment among the above-described embodiments and other embodiments or adding the extracted part of the configuration to an arbitrary embodiment.

Furthermore, in the above-described embodiments, a description is given of a mode in which the LED display device 1 as a light emitting device is formed with the first thin-film layer 20B as the first layer, the second thin-film layer 20G as the second layer and the third thin-film layer 20R as the third layer. However, the present invention is not limited to this mode and it is also possible to form a light emitting device with a first layer, a second layer and a third layer each made in a variety of different configurations.

The present invention is applicable to LED display devices in which a plurality of LEDs are arranged in a planar arrangement, for example.

7. Description Off Reference Characters

1, 201, 301, 401, 501: LED display device (light emitting device), 2, 202, 302, 402, 502: LED display unit, 2A: display region, 8, 208, 308, 408, 508: pixel unit, 8L: pixel length, 8S, 208S, 508S: light emission surface, 10: circuit board, 10S: substrate front surface, 11: base material part, 12, 12B, 12G, 12R, 512B: anode substrate pad, 13: dummy substrate pad, 14: substrate pad set, 18, 218, 418: thin-film layer set, 19: common wiring layer, 20: thin-film layer, 20B, 220B, 520B: first thin-film layer, 20G, 220G, 520G: second thin-film layer, 20R, 220R, 420R, 520R: third thin-film layer, 21, 21B, 21G, 21R, 421R, 521B, 521G, 521R: light emitting element, 22: light emitting unit, 23, 23B, 23G, 23R, 23C: vertical direction wiring, 24, 24B, 24G, 24R, 424R: light emission region, 25B, 25G, 25R: base insulation layer, 26B, 26G, 26R: interlayer insulation layer, 31B, 31G, 31R, 431R: cathode layer, 32, 32B, 32G, 32R, 432R: light emitting layer, 33, 33B, 33G, 33R, 433R: anode layer, 35B, 35G, 35R: cathode lead wiring, 36B, 36G, 36R: anode lead wiring, 45B, 45G, 45R: cathode pillar, 46GB, 46RB, 46RG: anode pillar, 271B: lower reflective layer, 272G: intermediate reflective layer, 381: lens, 510: transparent circuit board, 511: transparent base material part, 519: reflective layer, E: light emission direction, F: focal point.

What is claimed is:

1. A light emitting device comprising:

a first layer including a first light emitting element that makes a first light emission region emit light and a first transparent insulation member that covers the first light emitting element;

a second layer stacked on a light emission direction side of the first layer and including a second light emitting element that makes a second light emission region emit light and a second transparent insulation member that covers the second light emitting element;

a third layer stacked on the light emission direction side of the second layer and including a third light emitting element that makes a third light emission region, at least partially overlapping with the first light emission region and the second light emission region as viewed from the light emission direction, emit light and a third transparent insulation member that covers the third light emitting element; and a lens that is arranged on the light emission direction side of the third layer and refracts light, wherein a focal point of the lens is situated on a side in a direction opposite to the light emission direction relative to the third light emitting element, and wherein the third light emission region is formed so that its area as viewed from the light emission direction is larger than the first light emission region and the second light emission region.

2. The light emitting device according to claim 1, wherein the third light emitting element is a light emitting element having lower luminous efficiency than the first light emitting element and the second light emitting element.

3. The light emitting device according to claim 2, wherein the third light emitting element includes at least a gallium nitride-based light emitting layer.

4. The light emitting device according to claim 2, wherein the third light emitting element includes at least a light emitting layer including indium gallium nitride and a cathode layer including gallium nitride.

5. The light emitting device according to claim 1, wherein the third light emitting element emits light having a dominant wavelength longer than the dominant wavelength of at least one of the first light emitting element and the second light emitting element.

6. The light emitting device according to claim 1, further comprising a first reflective layer that is arranged between the first light emitting element and the third light emitting element in regard to the light emission direction and is formed not to overlap with the first light emission region or the second light emission region and to overlap with at least a part of the third light emission region as viewed from the light emission direction.

7. The light emitting device according to claim 6, wherein the first reflective layer is arranged between the second light emitting element and the third light emitting element in regard to the light emission direction and is electrically connected to a common terminal provided for each of the first light emitting element, the second light emitting element and the third light emitting element.

8. The light emitting device according to claim 1, further comprising a second reflective layer that is arranged on a side opposite to the light emission direction relative to the first light emitting element and is formed to overlap with at least part of the first light emission region, the second light emission region and the third light emission region as viewed from the light emission direction.

9. The light emitting device according to claim 1, further comprising:

a substrate arranged to adjoin a side of the first layer opposite to the light emission direction;

a first conductive column provided in the first layer and electrically connecting the first light emitting element and the substrate to each other;

a second conductive column provided in the first layer and the second layer and electrically connecting the second light emitting element and the substrate to each other; and a third conductive column provided in the first layer, the second layer and the third layer and electrically connecting the third light emitting element and the substrate to each other, wherein the first light emission region and the second light emission region are formed at positions not to overlap with the first conductive column, the second conductive column or the third conductive column as viewed from the light emission direction, and the third light emission region is formed at a position to overlap with the first conductive column and the second conductive column as viewed from the light emission direction.

10. The light emitting device according to claim 1, wherein each of the first light emitting element, the second light emitting element and the third light emitting element includes a light emitting layer, a cathode layer and an anode layer, and an area of contact between the light emitting layer and the cathode layer in the third light emitting element is larger than an area of contact between the light emitting layer and the cathode layer in the first light emitting element and an area of contact between the light emitting layer and the cathode layer in the second light emitting element.

11. The light emitting device according to claim 1, wherein in the first layer, the second layer and the third layer, a plurality of the first light emitting elements, a plurality of the second light emitting elements and a plurality of the third light emitting elements are respectively arranged in an array.

12. A light emitting device, comprising:

a first layer including a first light emitting element that makes a first light emission region emit light and a first transparent insulation member that covers the first light emitting element;

a second layer stacked on a light emission direction side of the first layer and including a second light emitting element that makes a second light emission region emit light and a second transparent insulation member that covers the second light emitting element; and a third layer stacked on the light emission direction side of the second layer and including a third light emitting element that makes a third light emission region, at least partially overlapping with the first light emission region and the second light emission region as viewed from the light emission direction, emit light and a third transparent insulation member that covers the third light emitting element, wherein the third light emission region is formed so that its area as viewed from the light emission direction is larger than the first light emission region and the second light emission region, and wherein at least one of the first light emission region and the second light emission region includes a part not overlapping with the third light emission region as viewed from the light emission direction.

13. The light emitting device according to claim 12, wherein a hole part penetrating the third light emitting element in the light emission direction is formed in the third light emission region, and a part of at least one of the first light emission region and the second light emission region is situated inside the hole part formed in the third light emission region as viewed from the light emission direction.

14. A light emitting device, comprising:

a first layer including a first light emitting element that makes a first light emission region emit light and a first transparent insulation member that covers the first light emitting element;

a second layer stacked on a light emission direction side of the first layer and including a second light emitting element that makes a second light emission region emit light and a second transparent insulation member that covers the second light emitting element;

a third layer stacked on the light emission direction side of the second layer and including a third light emitting element that makes a third light emission region, at least partially overlapping with the first light emission region and the second light emission region as viewed from the light emission direction, emit light and a third transparent insulation member that covers the third light emitting element; and a substrate arranged to adjoin a side of the first layer opposite to the light emission direction, wherein the third light emission region is formed so that its area as viewed from the light emission direction is larger than the first light emission region and the second light emission region, the first layer is provided with a conductive column that forms electrical connection between the second layer adjoining on the light emission direction side and the substrate adjoining on the side opposite to the light emission direction, the second layer is provided with the conductive column that forms electrical connection between the third layer adjoining on the light emission direction side and the first layer adjoining on the side opposite to the light emission direction, the first light emission region and the second light emission region are respectively formed at positions not to overlap with the conductive columns respectively formed in the first layer and the second layer as viewed from the light emission direction, and the third light emission region is formed at a position to overlap with at least part of the conductive columns respectively formed in the first layer and the second layer as viewed from the light emission direction.

15. A light emitting device comprising:

a first layer including a first light emitting element that makes a first light emission region emit light and a first transparent insulation member that covers the first light emitting element;

a second layer stacked on a light emission direction side of the first layer and including a second light emitting element that makes a second light emission region emit light and a second transparent insulation member that covers the second light emitting element;

a third layer stacked on the light emission direction side of the second layer and including a third light emitting element that makes a third light emission region, at least partially overlapping with the first light emission region and the second light emission region as viewed from the light emission direction, emit light and a third transparent insulation member that covers the third light emitting element; and a lens that is arranged on the light emission direction side of the third layer and refracts light, wherein a focal point of the lens is situated on a side in a direction opposite to the light emission direction relative to the third light emitting element, and wherein the third light emitting element includes an indium gallium nitride-based light emitting layer and a gallium nitride-based cathode layer in contact with the light emitting layer and has lower luminous efficiency than the first light emitting element and the second light emitting element.

* * * * *